United States Patent
Nowatari et al.

(10) Patent No.: US 10,050,221 B2
(45) Date of Patent: *Aug. 14, 2018

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Hiromi Nowatari, Atsugi (JP); Satoshi Seo, Kawasaki (JP); Nobuharu Ohsawa, Zama (JP); Takahiro Ushikubo, Atsugi (JP); Tetsuo Tsutsui, Kasuga (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/138,565

(22) Filed: Apr. 26, 2016

(65) Prior Publication Data
US 2016/0240808 A1 Aug. 18, 2016

Related U.S. Application Data

(63) Continuation of application No. 13/951,028, filed on Jul. 25, 2013, now Pat. No. 9,343,689, which is a (Continued)

(30) Foreign Application Priority Data

May 29, 2009 (JP) ................................ 2009-131096

(51) Int. Cl.
*H01L 51/50* (2006.01)
*B82Y 10/00* (2011.01)
(Continued)

(52) U.S. Cl.
CPC ............ *H01L 51/504* (2013.01); *B82Y 10/00* (2013.01); *H01L 51/5004* (2013.01);
(Continued)

(58) Field of Classification Search
None
See application file for complete search history.

(56) References Cited

U.S. PATENT DOCUMENTS 6,013,384 A 1/2000 Kido et al.
6,967,062 B2 11/2005 Hatwar et al.
(Continued)

FOREIGN PATENT DOCUMENTS

CN 001773744 A 5/2006
CN 001866574 A 11/2006
(Continued)

OTHER PUBLICATIONS

Tsutsui.T et al., "Electric Field-Assisted Bipolar Charge Spouting in Organic Thin-Film Diodes", Appl. Phys. Lett. (Applied Physics Letters), Jan. 19, 2004, vol. 84, No. 3, pp. 440-442.

(Continued)

*Primary Examiner* — Ali Naraghi
(74) *Attorney, Agent, or Firm* — Robinson Intellectual Property Law Office; Eric J. Robinson

(57) ABSTRACT

An object is to provide a light-emitting element capable of emitting light with a high luminance even at a low voltage, and having a long lifetime. The light-emitting element includes n EL layers between an anode and a cathode (n is a natural number of two or more), and also includes, between m-th EL layer from the anode and (m+1)-th EL layer (m is a natural number, $1 \leq m \leq n-1$), a first layer including a first donor material in contact with the m-th EL layer, a second layer including an electron-transport material and a second donor material in contact with the first layer, (Continued)

and a third layer including a hole-transport material and an acceptor material in contact with the second layer and the (m+1)-th EL layer.

23 Claims, 14 Drawing Sheets

Related U.S. Application Data continuation of application No. 12/785,648, filed on May 24, 2010, now Pat. No. 8,502,202.

(51) Int. Cl.
*H01L 51/52* (2006.01)
*H01L 51/00* (2006.01)

(52) U.S. Cl.
CPC ...... *H01L 51/5044* (2013.01); *H01L 51/5278* (2013.01); *H01L 51/006* (2013.01); *H01L 51/0048* (2013.01); *H01L 51/0052* (2013.01); *H01L 51/0053* (2013.01); *H01L 51/0058* (2013.01); *H01L 51/0061* (2013.01); *H01L 51/0072* (2013.01); *H01L 51/0081* (2013.01)

(56) References Cited

U.S. PATENT DOCUMENTS

| | | | |
|---|---|---|---|
| 7,270,871 B2 | 9/2007 | Jiang et al. | |
| 7,462,883 B2 | 12/2008 | Kumaki et al. | |
| 7,560,862 B2 | 7/2009 | Liao et al. | |
| 7,663,140 B2 | 2/2010 | Yamazaki et al. | |
| 7,728,517 B2 | 6/2010 | Aziz et al. | |
| 7,960,912 B2 | 6/2011 | Yasukawa et al. | |
| 7,968,214 B2 | 6/2011 | Noh et al. | |
| 8,076,671 B2 | 12/2011 | Yamazaki et al. | |
| 8,080,934 B2 | 12/2011 | Kido et al. | |
| 8,106,391 B2 | 1/2012 | Endo et al. | |
| 8,482,193 B2 | 7/2013 | Kido et al. | |
| 8,502,202 B2 * | 8/2013 | Nowatari | B82Y 10/00 257/40 |
| 8,536,569 B2 | 9/2013 | Yamazaki et al. | |
| 8,603,642 B2 | 12/2013 | Hatwar et al. | |
| 8,659,008 B2 | 2/2014 | Seo et al. | |
| 8,911,881 B2 | 12/2014 | Lee et al. | |
| 8,993,126 B2 * | 3/2015 | Nowatari | H01L 51/0078 257/40 |
| 9,209,415 B2 * | 12/2015 | Shitagaki | H01L 51/504 |
| 2003/0127967 A1 | 7/2003 | Tsutsui et al. | |
| 2003/0189401 A1 | 10/2003 | Kido et al. | |
| 2004/0185300 A1 | 9/2004 | Hatwar et al. | |
| 2005/0098207 A1 | 5/2005 | Matsumoto et al. | |
| 2006/0040132 A1 | 2/2006 | Liao et al. | |
| 2006/0087225 A1 | 4/2006 | Liao et al. | |
| 2006/0099447 A1 | 5/2006 | Lee et al. | |
| 2006/0220534 A1 | 10/2006 | Shibanuma et al. | |
| 2006/0240277 A1 | 10/2006 | Hatwar et al. | |
| 2006/0263629 A1 | 11/2006 | Aziz et al. | |
| 2006/0289882 A1 | 12/2006 | Nishimura et al. | |
| 2007/0040161 A1 | 2/2007 | Kumaki et al. | |
| 2007/0090376 A1 | 4/2007 | Kumaki et al. | |
| 2007/0114512 A1 | 5/2007 | Kumaki et al. | |
| 2007/0114527 A1 | 5/2007 | Kumaki et al. | |
| 2007/0182317 A1 | 8/2007 | Kido et al. | |
| 2007/0200125 A1 | 8/2007 | Ikeda et al. | |
| 2008/0171226 A1 | 7/2008 | Noh et al. | |
| 2008/0278064 A1 | 11/2008 | Kumaki et al. | |
| 2009/0085474 A1 | 4/2009 | Shitagaki et al. | |
| 2009/0102366 A1 | 4/2009 | Ushikubo et al. | |
| 2009/0130296 A1 | 5/2009 | Kwong et al. | |
| 2009/0189509 A1 | 7/2009 | Qiu et al. | |
| 2010/0007268 A1 | 1/2010 | Kim | |
| 2010/0219404 A1 | 9/2010 | Endo et al. | |
| 2012/0132895 A1 | 5/2012 | Kido et al. | |

FOREIGN PATENT DOCUMENTS

| | | |
|---|---|---|
| CN | 101399319 A | 4/2009 |
| CN | 101971384 A | 2/2011 |
| EP | 1351558 A | 10/2003 |
| EP | 1656000 A | 5/2006 |
| EP | 1944809 A | 7/2008 |
| EP | 2045847 A | 4/2009 |
| EP | 2051310 A | 4/2009 |
| EP | 2202818 A | 6/2010 |
| JP | 10-270171 A | 10/1998 |
| JP | 2003-272860 A | 9/2003 |
| JP | 2005-209643 A | 8/2005 |
| JP | 2006-012793 A | 1/2006 |
| JP | 2006-135295 A | 5/2006 |
| JP | 2006-210845 A | 8/2006 |
| JP | 2006-332048 A | 12/2006 |
| JP | 2006-351398 A | 12/2006 |
| JP | 2007-043130 A | 2/2007 |
| JP | 3933591 | 6/2007 |
| JP | 2007-179933 A | 7/2007 |
| JP | 2008-518400 | 5/2008 |
| JP | 2008-153590 A | 7/2008 |
| JP | 2008-537314 | 9/2008 |
| JP | 2009-043612 A | 2/2009 |
| JP | 2009-093810 A | 4/2009 |
| JP | 2009-117356 A | 5/2009 |
| KR | 2006-0048920 A | 5/2006 |
| KR | 2006-0059321 A | 6/2006 |
| KR | 2006-0120505 A | 11/2006 |
| KR | 2010-0070350 A | 6/2010 |
| KR | 2012-0073271 A | 7/2012 |
| KR | 2013-0097647 A | 9/2013 |
| TW | 200610806 | 4/2006 |
| WO | WO-2001/015244 | 3/2001 |
| WO | WO-2005/115059 | 12/2005 |
| WO | WO-2006/047170 | 5/2006 |
| WO | WO-2006/115848 | 11/2006 |
| WO | WO-2007/064009 | 6/2007 |
| WO | WO-2009/041635 | 4/2009 |
| WO | WO-2011/027653 | 3/2011 |
| WO | WO-2011/162105 | 12/2011 |

OTHER PUBLICATIONS

Liao.L et al., "High-efficiency tandem organic light-emitting diodes", Appl. Phys. Lett. (Applied Physics Letters), Jan. 12, 2004, vol. 84, No. 2, pp. 167-169.

Kanno.H et al., "High Efficiency Stacked Organic Light-Emitting Diodes Employing Li2O as a Connecting Layer", Jpn. J. Appl. Phys. (Japanese Journal of Applied Physics), Dec. 7, 2006, vol. 45, No. 12, pp. 9219-9223.

Ikeda.H et al., "P-185:Low-Drive-Voltage OLEDs With a Buffer Layer Having Molybdenum Oxide", SID Digest '06 : SID International Symposium Digest of Technical Papers, 2006, vol. 37, pp. 923-926.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Matsumoto.T et al., "27.5L: Late-News Paper: Multiphoton Organic EL Device Having Charge Generation Layer", SID Digest '03 : SID International Symposium Digest of Technical Papers, 2003, vol. 34, pp. 979-981.

Chang.C et al., "Highly Efficient White Organic Electroluminescent Devices Based on Tandem Architecture", Appl. Phys. Lett. (Applied Physics Letters), Dec. 12, 2005, vol. 87, No. 25, pp. 253501-1-253501-3.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Terai.M et al., "Electric-Field-Assisted Bipolar Charge Generation From Internal Charge Separation Zone Composed of Doped Organic Bilayer", Appl. Phys. Lett. (Applied Physics Letters), Feb. 21, 2007, vol. 90, pp. 083502-1-083502-3.

(56) References Cited

OTHER PUBLICATIONS

Law.C et al., "Effective organic-based connection unit for stacked organic light-emitting devices", Appl. Phys. Lett. (Applied Physics Letters), Sep. 28, 2006, vol. 89, No. 13, pp. 133511-1-133511-3.
Leem.D et al., "Highly Efficient Tandem P—I—N Organic Light-Emitting Diodes Adopting a Low Temperature Evaporated Rhenium Oxide Interconnecting Layer", Appl. Phys. Lett. (Applied Physics Letters), Sep. 8, 2008, vol. 93, No. 10, pp. 103304-1-103304-3.
Birnstock.J et al., "54.3: Distinguished Paper: White Stacked OLED With 35 LM/W and 100,000 Hours Lifetime at 1000 CD/M2 for Display and Lighting Applications", SID Digest '08 : SID International Symposium Digest of Technical Papers, May 20, 2008, vol. 39, pp. 822-825.
Lai.S et al., "Copper Hexadecafluorophthalocyanine and Copper Phthalocyanine as a Pure Organic Connecting Unit in Blue Tandem Organic Light-Emitting Devices", J. Appl. Phys. (Journal of Applied Physics), 2007, vol. 101, pp. 014509-1-014509-4.
Liao.L et al., "Power Efficiency.Improvement in a Tandem Organic Light-Emitting Diode", Appl. Phys. Lett. (Applied Physics Letters), Jun. 2, 2008, vol. 92, No. 22, pp. 223311-1-223311-3.
Chan.M et al., "Influences of Connecting Unit Architecture on the Performance of Tandem Organic Light-Emitting Devices", Adv. Funct. Mater. (Advanced Functional Materials), 2007, vol. 17, No. 14, pp. 2509-2514.
Hiramoto.M et al., "P—I—N Like Behavior in Three-Layered Organic Solar Cells Having a Co-Deposited Interlater of Pigments", J. Appl. Phys. (Journal of Applied Physics), Oct. 15, 1992, vol. 72, No. 8, pp. 3781-3787.
Brabec.C et al., "Photovoltaic Properties of Conjugated Polymer/Methanofullerene Composites Embedded in a Polystyrene Matrix", J. Appl. Phys. (Journal of Applied Physics), May 1, 1999, vol. 85, No. 9, pp. 6866-6872.
International Search Report (Application No. PCT/JP2010/058240) Dated Jul. 20, 2010.
Written Opinion (Application No. PCT/JP2010/058240) Dated Jul. 20, 2010.
European Search Report (Application No. 10780432.0) Dated Aug. 20, 2013.
Chinese Office Action (Application No. 201080024698.0) Dated Feb. 8, 2014.
Hill.I et al., "Organic semiconductor heterointerfaces containing bathocuproine", J. Appl. Phys. (Journal of Applied Physics), Oct. 15, 1999, vol. 86, No. 8, pp. 4515-4519.
European Search Report (Application No. 10780432.0) Dated Apr. 25, 2014.

\* cited by examiner

800

810

820

830

840

LIGHT-EMITTING ELEMENT, LIGHT-EMITTING DEVICE, ELECTRONIC DEVICE, AND LIGHTING DEVICE

TECHNICAL FIELD

The present invention relates to a light-emitting element having light-emitting layers between a pair of electrodes. In addition, the present invention relates to a light-emitting device in which the light-emitting element is used and an electronic device and a lighting device in each of which the light-emitting device is used.

BACKGROUND ART

In recent years, a light-emitting element in which a light-emitting organic compound or a light-emitting inorganic compound is used as a light-emitting material has been actively developed. In particular, a light-emitting element called an electroluminescence (hereinafter referred to as EL) element, which has a structure in which a light-emitting layer containing a light-emitting material is provided between a pair of electrodes, has attracted attention as a next-generation flat panel display element because of its characteristics such as thinness, lightweight, high response time, and direct-current low-voltage driving. In addition, a display in which an EL element is used has a feature that it is excellent in contrast and image quality and has a wide angle of view. Moreover, because the EL element is a plane light source, application to a light source such as a backlight of a liquid crystal display and lighting is considered.

An EL element includes a pair of electrodes and a light-emitting layer which contains a light-emitting material and is provided between the pair of electrodes. When current flows in the light-emitting layer, the light-emitting material is excited, and then the EL element can emit light of a predetermined color. To make a large amount of current flow in the light-emitting layer is effective in increasing the luminance of the EL element. However, application of a large amount of current into the EL element increases power consumption. In addition, the application of a large amount of current in the light-emitting layer also accelerates deterioration of the EL element.

In view of the above, a light-emitting element in which a plurality of light-emitting layers are stacked has been proposed (e.g., Patent Document 1). Patent Document 1 discloses a light-emitting element in which a plurality of light-emitting units (hereinafter in this specification, the light-emitting unit is also referred to as an EL layer) are provided and the light-emitting units are separated by a charge-generation layer. More specifically, it discloses a light-emitting element in which a charge-generation layer formed of vanadium pentoxide is provided on a metal-doped layer functioning as an electron-injection layer of a first light-emitting unit, and further a second light-emitting unit is provided over the charge-generation layer. The light-emitting element disclosed in Patent Document 1 can emit light with a higher luminance than a light-emitting element having one light-emitting layer, when current having the same current density is applied to the elements.

REFERENCE

Patent Document

[Patent Document 1] Japanese Patent Laid-Open No. 2003-272860

DISCLOSURE OF INVENTION

It is an object of one embodiment of the present invention to provide a light-emitting element capable of emitting light with a high luminance.

It is another object of one embodiment of the present invention to provide a light-emitting element with a long lifetime.

It is another object of one embodiment of the present invention to provide a light-emitting element capable of low-voltage driving.

It is another object of one embodiment of the present invention to provide a light-emitting device with low power consumption.

It is another object of one embodiment of the present invention to provide an electronic device or a lighting device with low power consumption.

One embodiment of the present invention is a light-emitting element including n EL layers between an anode and a cathode (n is a natural number of two or more) and also includes, between m-th EL layer from the anode and (m+1)-th EL layer (m is a natural number, $1 \leq m \leq n-1$), a first layer including a first donor material and being in contact with the m-th EL layer, a second layer including an electron-transport material and a second donor material and being in contact with the first layer, and a third layer including a hole-transport material and an acceptor material and being in contact with the second layer and with the (m+1)-th EL layer.

Another embodiment of the present invention is a light-emitting element including n EL layers between an anode and a cathode (n is a natural number of two or more) and also includes, between m-th EL layer from the anode and (m+1)-th EL layer (m is a natural number, $1 \leq m \leq n-1$), a first layer including a first electron-transport material and a first donor material and being in contact with the m-th EL layer, a second layer including a second electron-transport material having a LUMO level which is lower than a LUMO level of the first electron-transport material and a second donor material and being in contact with the first layer, and a third layer including a hole-transport material and an acceptor material and being in contact with the second layer and with the (m+1)-th EL layer.

Another embodiment of the present invention is a light-emitting device manufactured using the above-described light-emitting element.

In addition, another embodiment of the present invention is an electronic device including the above-mentioned light-emitting device.

Furthermore, another embodiment of the present invention is a lighting device including the above-mentioned light-emitting device. Note that the term "lighting device" in this specification means a light source which can control lighting and non-lighting, and the purpose of which is to enable people to have better lives with light. For example, with the use of light, a scene, a visual object, and the periphery thereof are lit up to be more recognizable, or information is transmitted with a visual signal.

Note that the ordinal numbers such as "first" and "second" in this specification are used for convenience and do not denote the order of steps and the stacking order of layers. In addition, the ordinal numbers in this specification do not denote particular names which specify the invention.

The light-emitting element of one embodiment of the present invention has a plurality of EL layers, and accordingly, light emission with a high luminance is possible.

In addition, since the light-emitting element of one embodiment of the present invention has a plurality of EL layers, the lifetime in the case in which the light-emitting element emits light with a high luminance can be improved.

Furthermore, the light-emitting element of one embodiment of the present invention has a structure capable of transporting carries between the plurality of EL layers favorably. Therefore, the driving voltage of the light-emitting element can be reduced.

The light-emitting device of one embodiment of the present invention includes the light-emitting element with a reduced driving voltage, which results in a reduction in the power consumption of the light-emitting device.

The electronic device or lighting device which is one embodiment of the present invention includes the light-emitting device with reduced power consumption, which can result in a reduction in the power consumption of the electronic device or the lighting device.

BEST MODE FOR CARRYING OUT THE INVENTION

Embodiments and examples of the present invention are detailed below with reference to the accompanying drawings. Note that it is easily understood by those skilled in the art that the present invention is not limited to the description below and that the modes and details can be modified in various ways without departing from the spirit and scope of the present invention. Therefore, the present invention should not be construed as being limited to the description of embodiments and examples below.

Embodiment 1

In this embodiment, one embodiment of a light-emitting element is described with reference to FIGS. 1A and 1B.

Figure 1A:
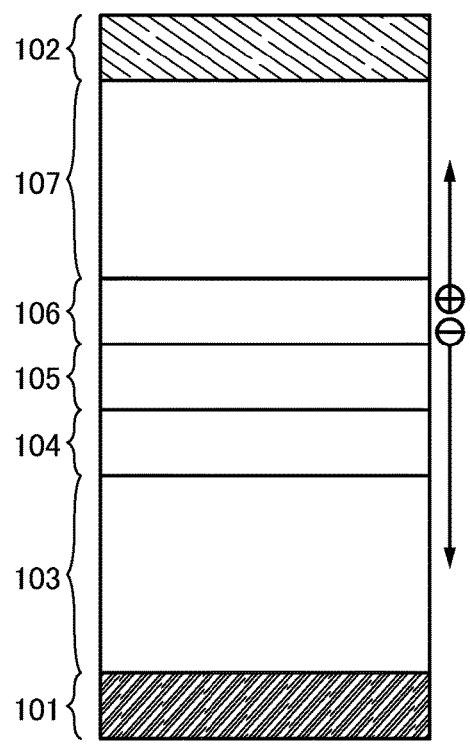
FIGS. 1A and 1B respectively illustrate an example of an element structure of a light-emitting element and an example of a band diagram of the light-emitting element described in Embodiment 1.

A light-emitting element illustrated in FIG. 1A includes a first EL and a second EL layer 107 each including a light-emitting region between a pair of electrodes (an anode 101 and a cathode 102). In addition, the light-emitting element also includes, from the anode 101 side, an electron-injection buffer layer 104 in contact with the first EL layer 103, an electron-relay layer 105 in contact with the electron-injection buffer layer 104, and a charge-generation layer 106 in contact with the electron-relay layer 105 and the second EL layer 107.

Purposes of the electron-injection buffer layer 104 are to reduce an injection barrier in injection of electrons into the first EL layer 103, and to inject electrons more efficiently into the first EL layer 103. In this embodiment, the electron-injection buffer layer 104 is formed including a donor material.

The purpose of the electron-relay layer 105 is to immediately transfer electrons to the electron-injection buffer layer 104. In this embodiment, the electron-relay layer 105 is formed including an electron-transport material and a donor material. Note that the electron-transport material used for the electron-relay layer 105 is such a material that has a high electron-transport property and that its LUMO (lowest unoccupied molecular orbital) level is between the LUMO level of the first EL layer 103 which is described in this embodiment and an acceptor level of an acceptor material in the charge-generation layer 106. Specifically, a material having a LUMO level greater than or equal to −5.0 eV is preferably used as the electron-transport material used for the electron-relay layer 105. Furthermore, a material having a LUMO level greater than or equal to −5.0 eV and lower than or equal to −3.0 eV is more preferably used as the electron-transport material used for the electron-relay layer 105.

The purpose of the charge-generation layer 106 is to generate holes and electrons, which are carriers of the light-emitting element. In this embodiment, the charge-generation layer 106 is formed including a hole-transport material and an acceptor material.

Figure 1B:
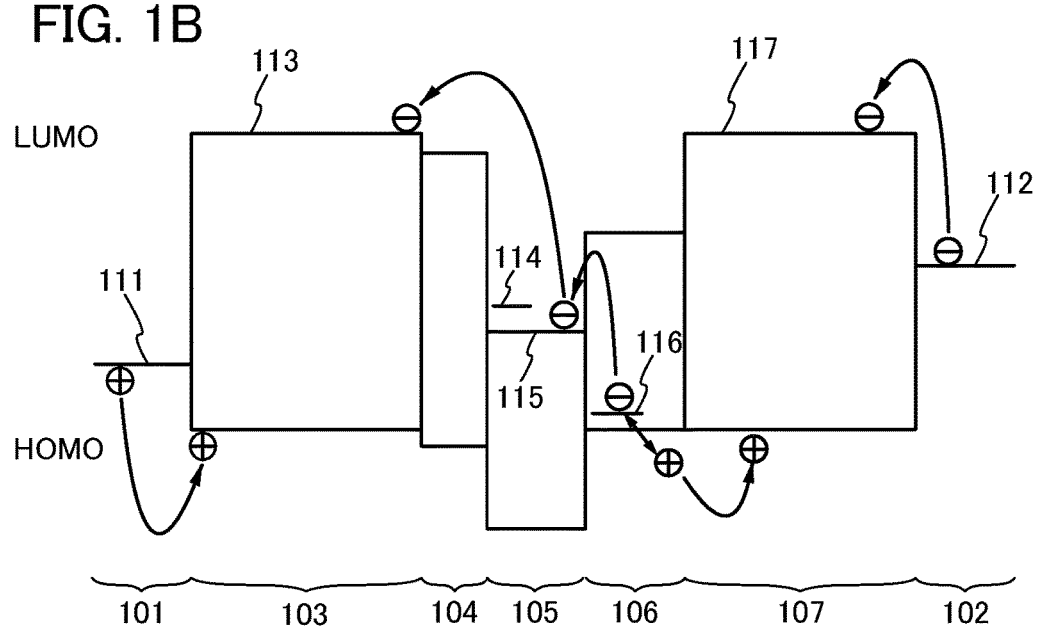

FIG. 1B illustrates a band diagram of the element structure illustrated in FIG. 1A. In FIG. 1B, reference numerals 111, 112, 113, 114, 115, 116, and 117 respectively denote a Fermi level of the anode 101, a Fermi level of the cathode 102, the LUMO level of the first EL layer 103, a donor level of the donor material in the electron-relay layer 105, the LUMO level of the electron-transport material in the electron-relay layer 105, the acceptor level of the acceptor material in the charge-generation layer 106, and the LUMO level of the second EL layer 107.

In FIG. 1B, electrons generated in the charge-generation layer 106 transfer into the LUMO level of the electron-transport material in the electron-relay layer 105. Further, they transfer through the electron-injection buffer layer 104 to the LUMO level of the first EL layer 103. After that, in the first EL layer 103, holes injected from the anode 101 and the electrons injected from the charge-generation layer 106 recombine. As a result, the first EL layer 103 emits light. As in the first EL layer 103, in the second EL layer 107, holes injected from the charge-generation layer 106 and electrons injected from the cathode 102 recombine. As a result, the second EL layer 107 emits light.

The light-emitting element described in this embodiment includes the electron-relay layer 105 containing an electron-transport material and a donor material. The donor material moves the LUMO level of the electron-transport material to a lower energy level. The LUMO level of the electron-transport material in the electron-relay layer 105, which is initially relatively low because it is lower than the LUMO level of the first EL layer 103, is further decreased by the donor material. As a result, the barrier in acceptance of electrons by the electron-relay layer 105 from the charge-generation layer 106 is reduced. In addition, electrons that the electron-relay layer 105 accepts are immediately injected into the first EL layer 103 by the electron-injection buffer layer 104 without generation of a large injection barrier. As a result, low-voltage driving of the light-emitting element is possible.

Next, specific examples of each material described above are given.

The donor material contained in the electron-injection buffer layer 104 and the electron-relay layer 105 can be an alkali metal, an alkaline earth metal, a rare earth metal, or compounds of an alkali metal, an alkaline earth metal, or a rare earth metal (including an oxide, a halide, and carbonate). Specific examples include metals such as lithium (Li), cesium (Cs), magnesium (Mg), calcium (Ca), strontium (Sr), europium (Eu), and ytterbium (Yb) and compounds thereof. These metals or metal compounds are preferable because their electron-injection property is high.

The electron-transport material contained in the electron-relay layer 105 can be a perylene derivative, a nitrogen-containing condensed aromatic compound, or the like.

Specific examples of the perylene derivative include 3,4,9,10-perylenetetracarboxylicdianhydride (abbreviation: PTCDA), 3,4,9,10-perylenetetracarboxylic-bis-benzimidazole (abbreviation: PTCBI), N,N-dioctyl-3,4,9,10-perylenetetracarboxylic diimide (abbreviation: PTCDI-C8H), N,N-dihexyl-3,4,9,10-perylenetetracarboxylicdiimide (abbreviation: HexPTC), and the like.

Specific examples of the nitrogen-containing condensed aromatic compound include pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: $HAT(CN)_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like. Note that a nitrogen-containing condensed aromatic compound is preferably used as the electron-transport material contained in the electron-relay layer 105 because of its stability. Furthermore, of nitrogen-containing condensed aromatic compounds, a compound having an electron-withdrawing group such as a cyano group or a fluoro group is preferably used, in which case electrons are easily accepted in the electron-relay layer 105.

Alternatively, it is also possible to use the following as the electron-transport material contained in the electron-relay layer 105: perfluoropentacene, 7,7,8,8-tetracyanoquinodimethane (abbreviation: TCNQ), 1,4,5,8-naphthalenetetracarboxylicdianhydride (abbreviation: NTCDA), copper hexadecafluorophthalocyanine (abbreviation: $F_{16}CuPc$), N,N'-bis(2,2,3,3,4,4,5,5,6,6,7,7,8,8-pentadecafluorooctyl-1,4,5,8-naphthalenetetracarboxylic diimide (abbreviation: NTCDI-C8F), 3',4'-dibutyl-5,5''-bis(dicyanomethylene)-5,5''-dihydro-2,2':5',2''-terthiophen (abbreviation: DCMT), a methanofullerene (for example, [6, 6]-phenyl $C_{61}$ butyric acid methyl ester), and the like.

The hole-transport material contained in the charge-generation layer 106 can be any of a variety of organic compounds such as an aromatic amine compound, a carbazole derivative, an aromatic hydrocarbon, and a high molecular compound (such as an oligomer, a dendrimer, or a polymer). Most of the materials described here have a hole mobility of greater than or equal to $1\times10^{-6}$ $cm^2/Vs$.

Specific examples of the aromatic amine compound include 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), N,N-bis(4-methylphenyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis[4-[bis(3-methylphenyl)amino]phenyl]-N,N'-diphenyl-[1,1'-Biphenyl]-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. In addition, the following can be given: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Specific examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene; tetracene; rubrene, perylene; 2,5,8,11-tetra(tert-butyl)perylene; and the like. Further, the aromatic hydrocarbon may have a vinyl skeleton. As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given.

Further, a high molecular compound such as poly(N-vinylcarbazole) (abbreviation: PVK) or poly(4-vinyltriphenylamine) (abbreviation: PVTPA) can also be used as the hole-transport material.

The hole-transport material described above preferably has a hole mobility of greater than or equal to $1\times10^6$ $cm^2/Vs$.

Note that any other substance that has a higher hole-transport property than an electron-transport property can be used.

In the case of employing an evaporation method for formation of the above aromatic hydrocarbon, it is preferable that the number of carbon atoms that forms a condensed ring be 14 to 42 in terms of evaporativity at the time of evaporation or film quality after film formation.

As the acceptor material contained in the charge-generation layer 106, a transition metal oxide and an oxide of a metal belonging to Groups 4 to 8 of the periodic table can be used. Specifically, metal oxides such as vanadium oxide, niobium oxide, tantalum oxide, chromium oxide, molybdenum oxide, tungsten oxide, manganese oxide, and rhenium oxide can be given. These metal oxides are preferable because they have high electron-accepting properties. In particular, molybdenum oxide is preferably used as the acceptor material. Note that molybdenum oxide has a feature of a low hygroscopic property.

Further, electron-injection buffer layer 104, the electron-relay layer 105, and the charge-generation layer 106 can be formed by any of a variety of methods regardless of a dry process (e.g., a vacuum evaporation method or a sputtering method) or a wet process (e.g., an ink-jet method, a spin coating method, or an application method).

Next, specific examples of the anode 101 and the cathode 102 which are described above are given.

The anode 101 can be formed using a metal, an alloy, an electrically-conductive compound, a mixture of these materials, or the like, having a high work function (specifically, a work function of greater than or equal to 4.0 eV is preferable). Specifically, conductive metal oxides such as indium oxide-tin oxide (ITO: indium tin oxide), indium oxide-tin oxide containing silicon or silicon oxide, indium oxide-zinc oxide (IZO: indium zinc oxide), and indium oxide containing tungsten oxide and zinc oxide can be given.

Thin films of these conductive metal oxides can be formed by a sputtering method. Alternatively, the films can be formed by a sol-gel method or the like. For example, a film of indium oxide-zinc oxide (IZO) can be formed by a sputtering method with use of a target in which zinc oxide is added to indium oxide at 1 wt % to 20 wt %. Indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively.

In addition, it is possible to use the following for the anode 101: gold (Au), platinum (Pt), nickel (Ni), tungsten (W), chromium (Cr), molybdenum (Mo), iron (Fe), cobalt (Co), copper (Cu), palladium (Pd), titanium (Ti), a nitride thereof (e.g., titanium nitride), and an oxide such as molybdenum oxide, vanadium oxide, ruthenium oxide, tungsten oxide, manganese oxide, or titanium oxide. Alternatively, a conductive polymer such as poly(3,4-ethylenedioxythiophene)/poly(styrenesulfonic acid) (abbreviation: PEDOT/PSS) or polyaniline/poly(styrenesulfonic acid) (abbreviation: PAni/PSS) may be used. Note that, in the case in which a charge-generation layer is provided in contact with the anode 101 as a part of the first EL layer 103, a variety of conductive materials can be used for the anode 101 regardless of the magnitude of their work functions. Note that the charge-generation layer can have the same structure as that of the charge-generation layer 106 provided between the first EL layer 103 and the second EL layer 107 described above.

The cathode 102 can be formed using a metal, an alloy, an electrically-conductive compound, a mixture of these materials, or the like, having a low work function (specifically, a work function of less than or equal to 3.8 eV is preferable). Specifically, the following can be given: an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these elements (e.g., MgAg or AlLi), a rare-earth metal such as europium (Eu) or ytterbium (Yb), an alloy containing these elements, and the like. Note that a film of an alkali metal, an alkaline earth metal, or an alloy thereof can be formed by a vacuum evaporation method. Alternatively, an alloy containing an alkali metal or an alkaline earth metal can be formed by a sputtering method.

Alternatively, the cathode 102 can be formed using a stack of a thin film of an alkali metal compound, an alkaline earth metal compound, or a rare earth metal compound (e.g., lithium fluoride (LiF), lithium oxide (LiOx), cesium fluoride (CsF), calcium fluoride ($CaF_2$), or erbium fluoride ($ErF_3$)) and a film of a metal such as aluminum. Note that, in the case in which a charge-generation layer is provided in contact with the cathode 102 as a part of the second EL layer 107, a variety of conductive materials can be used for the cathode 102 regardless of the magnitude of their work functions. Note that the charge-generation layer can have the same structure as that of the charge-generation layer 106 provided between the first EL layer 103 and the second EL layer 107 described above.

Note that in the light-emitting element described in this embodiment, at least either the anode 101 or the cathode 102 may transmit light having the wavelength of the emitted light. The light-transmitting property can be ensured with use of a transparent electrode such as ITO, or reduction in the thickness of an electrode.

Next, specific examples of the first EL layer and the second EL layer which are described above are given.

The first EL layer 103 and the second EL layer 107 each may include at least a light-emitting layer containing a light-emitting material. That is, the first EL layer 103 and the second EL layer 107 may have a structure in which a light-emitting layer and layers other than the light-emitting layer are stacked. Note that the light-emitting layer included in the first EL layer 103 may be different from the light-emitting layer included in the second EL layer 107. Alternatively, the first EL layer 103 and the second EL layer 107 may independently have a structure in which a light-emitting layer and layers other than the light-emitting layer are stacked.

Examples of the layers other than the light-emitting layer include a layer containing a hole-injection material (a hole-injection layer), a layer containing a hole-transport material (a hole-transport layer), a layer containing an electron-transport material (an electron-transport layer), a layer containing an electron-injection material (an electron-injection layer), a layer containing a bipolar (electron-transport and hole-transport) material, and the like. These layers can be combined as appropriate.

Described below are specific examples of materials contained in layers in the case in which the first EL layer 103 and the second EL layer 107 are formed including the hole-injection layer, the hole-transport layer, the light-emitting layer, the electron-transport layer, and the electron-injection layer.

The hole-injection layer contains a hole-injection material. As the hole-injection material, molybdenum oxide, vanadium oxide, ruthenium oxide, tungsten oxide, manganese oxide, or the like can be used. Alternatively, a phthalocyanine-based compound such as phthalocyanine (abbreviation: H$_2$Pc) or copper phthalocyanine (abbreviation: CuPc), a polymer such as PEDOT/PSS, or the like can be used as the hole-injection material.

The hole-transport layer contains a hole-transport material. As the hole-transport material, the following can be given: aromatic amine compounds such as NPB, TPD, TCTA, TDATA, MTDATA and 4,4'-bis[N-(spiro-9,9'-bifluoren-2-yl)-N-phenylamino]biphenyl (abbreviation: BSPB); and carbazole derivatives such as PCzPCA1, PCzPCA2, PCzPCN1, CBP, TCPB, and CzPA. Alternatively, it is also possible to use the following as the hole-transport material: PVK, PVTPA, poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine (abbreviation: Poly-TPD). Most of the substances listed here have a hole mobility of greater than or equal to 1×10$^{-6}$ cm$^2$/Vs. Note that any other material may also be used as long as it is a substance in which the hole-transport property is higher than the electron-transport property. Furthermore, the hole-transport layer is not limited to a single layer, but can be two or more layers formed using the aforementioned materials stacked.

The light-emitting layer contains a light-emitting material. The light-emitting material can be a fluorescent compound or a phosphorescent compound which is described below.

Examples of the fluorescent compound include the following: N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-antryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N'N'-triphenyl-1,4-phenylenediamine] (abbreviation: DPABPA), N,9-diphenyl-N-[4-(9,10-diphenyl-2-anthryl)phenyl]-9H-carbazole-3-amine (abbreviation: 2PCAPPA), N-[4-(9,10-diphenyl-2-anthryl)phenyl]-N,N'N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[i]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and the like.

Examples of the phosphorescent compound include the following: bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5'-bistrifluoromethylphenyl)pyridinato-N,C$^{2'}$]iridium(III)picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIr(acac)), tris(2-phenylpyridinato-N,C$^{2'}$)iridium(III) (abbreviation: Ir(ppy)$_3$), bis(2-phenylpyridinato)iridium(III) acetylacetonato (abbreviation: Ir(ppy)$_2$(acac)), bis(benzo[h]quinolinato)iridium(III)acetylacetonate (abbreviation: Ir(bzq)$_2$(acac)), bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato-N,C$^{2'}$]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), bis[2-(2'-benzo[4,5-a]thienyl)pyridinato-N,C$^{3'}$]iridium(III) acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), 2,3,7,8,12,13,17,18-octaethyl-21H,23H-porphyrin platinum(II) (abbreviation: PtOEP), tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and the like.

Note that the light-emitting layer preferably has a structure in which these light-emitting materials are dispersed in a host material. As the host material, the following can be used. For example, it is possible to use a hole-transport material: an aromatic amine compound such as NPB, TPD, TCTA, TDATA, MTDATA, or BSPB; a carbazole derivative such as PCzPCA1, PCzPCA2, PCzPCN1, CBP, TCPB, or CzPA; or a high molecular compound such as PVK, PVTPA, PTPDMA, or Poly-TPD. It is also possible to use an electron-transport material: a metal complex having a quinoline skeleton or a benzoquinoline skeleton such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolate)aluminum (abbreviation: BAlq); a metal complex having an oxazole-based or thiazole-based ligand such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 9-[4-(5-phenyl-1,3,4-oxadiazol-2- yl)phenyl]carbazole (abbreviation: CO11); 3-(4-biphenylyl)-4-phenyl-5-(4-tert-butylphenyl)-1,2,4-triazole (abbreviation: TAZ), bathophenanthroline (abbreviation: BPhen); bathocuproine (abbreviation: BCP); poly[(9,9-dihexylfluorene-2,7-diyl)-co-(pyridine-3,5-diyl)](abbreviation: PF-Py); or poly[(9,9-dioctyllfluorene-2,7-diyl)-co-(2,2'-bipyridine-6,6'-diyl)](abbreviation: PF-BPy).

The electron-transport layer contains an electron-transport material. As the electron-transport material, a metal complex having a quinoline skeleton or a benzoquinoline skeleton, such as Alq, Almq$_3$, BeBq$_2$, or BAlq can be used. In addition to the above, a metal complex having an oxazole-based or thiazole-based ligand, such as Zn(BOX)$_2$ or Zn(BTZ)$_2$ can also be used. Furthermore, in addition to the above metal complexes, PBD, OXD-7, CO11, TAZ, BPhen, BCP, PF-Py, PF-BPy or the like can also be used as the electron-transport material. Most of the materials listed here have an electron mobility of greater than or equal to $1 \times 10^{-6}$ cm$^2$/Vs. Note that any other material may also be used as long as it is a substance in which the electron-transport property is higher than the hole-transport property. Furthermore, the electron-transport layer is not limited to a single layer, but can be two or more layers formed using the aforementioned materials stacked.

The electron-injection layer contains an electron-injection material. As the electron-injection material, the following can be given: an alkali metal or an alkaline earth metal such as lithium fluoride (LiF), cesium fluoride (CsF), and calcium fluoride (CaF$_2$), and a compound thereof. Alternatively, an electron-transport material containing an alkali metal, an alkaline earth metal, or a compound thereof (e.g., Alq layer containing magnesium (Mg)) can be used as the electron-injection material. Such a structure makes it possible to increase the efficiency of injection of electrons from the cathode 102.

In the case in which a charge-generation layer is provided in the first EL layer 103 or the second EL layer 107, the charge-generation layer contains a hole-transport material and an acceptor material. The charge-generation layer may be not only a layer containing a hole-transport material and an acceptor material in the same film but also a stack of a layer containing a hole-transport material and a layer containing an acceptor material. However, in the case of the stacked-layer structure, the layer containing an acceptor material is in contact with the anode 101 or the cathode 102.

The provision of the charge-generation layer in the first EL layer 103 or the second EL layer 107 makes it possible to form the anode 101 or the cathode 102 without consideration of a work function of a material for forming the electrodes. Note that the charge-generation layer provided in the first EL layer 103 or the second EL layer 107 can have the same structure and can be formed using the same materials as those of the charge-generation layer 106 provided between the first EL layer 103 and the second EL layer 107 described above. Therefore, the above description is to be referred to.

With the stack of these layers in an appropriate combination, the first EL layer 103 and the second EL layer 107 can be formed. Further, as a formation method of the first EL layer 103 or the second EL layer 107, any of a variety of methods (e.g., a dry process and a wet process) can be selected as appropriate in a manner that depends on a material to be used. For example, a vacuum evaporation method, an inkjet method, a spin coating method, or the like may be used. Note that a different formation method may be employed for each layer.

The light-emitting element described in this embodiment can be manufactured by combination of the above-described materials. Because light from the above-described light-emitting material in this light-emitting element can be emitted, a variety of emission colors can be formed by changing the type of the light-emitting material that is used for the light-emitting layer. In addition, with use of a plurality of light-emitting materials of different emission colors as the light-emitting material, light emission having a broad spectrum or white light emission can also be performed.

Note that, although the light-emitting element in which two EL layers are provided is described in this embodiment, the number of EL layers is not limited to two, but may be more than two, for example, three. In the case in which n EL layers are provided in a light-emitting element (n is a natural number of two or more), with a stack of an electron-injection buffer layer, an electron-relay layer, and a charge-generation layer which are provided in this order between m-th EL layer from the anode side and (m+1)-th EL layer (m is a natural number, $1 \leq m \leq n-1$), the driving voltage of the light-emitting element can be reduced.

Further, the light-emitting element described in this embodiment can be manufactured over any of a variety of substrates. As the substrate, for example, a substrate made of glass, plastic, a metal plate, metal foil, or the like can be used. In the case of extracting light emission of the light-emitting element from the substrate side, a substrate having a light-transmitting property may be used. Note that a substrate other than the above may also be used as long as it can serve as a support in the manufacturing process of the light-emitting element.

Note that the structure in this embodiment can be combined with any of the structures in other embodiments as appropriate.

Embodiment 2

In this embodiment, an example of a light-emitting element described in Embodiment 1 is described. Specifically, described is a case in which an electron-injection buffer layer 104 included in the light-emitting element described in Embodiment 1 is formed of a single layer of a donor material, with reference to FIGS. 2A and 2B.

Figure 2A:
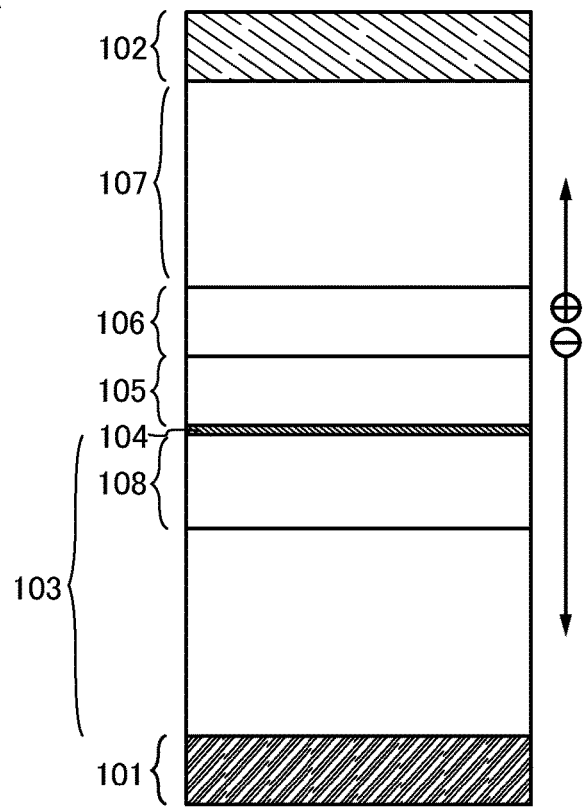
FIGS. 2A and 2B respectively illustrate an example of an element structure of a light-emitting element and an example of a band diagram of the light-emitting element described in Embodiment 2.

In a light-emitting element of this embodiment, as illustrated in FIG. 2A, a first EL layer 103 and a second EL layer 107 including a light-emitting region are interposed between a pair of electrodes (an anode 101 and a cathode 102). In addition, the light-emitting element includes, from the anode 101 side, the electron-injection buffer layer 104 in contact with the first EL layer 103, an electron-relay layer 105 in contact with the electron-injection buffer layer 104, and a charge-generation layer 106 in contact with the electron-relay layer 105 and the second EL layer 107.

The anode 101, the cathode 102, the first EL layer 103, the electron-relay layer 105, the charge-generation layer 106, and the second EL layer 107 in this embodiment can be formed using materials similar to those described in Embodiment 1 and can have structures similar to those described in Embodiment 1. Therefore, the description in Embodiment 1 is to be referred to.

In this embodiment, examples of a material used for the electron-injection buffer layer 104 include the following materials having a high electron-injection property: alkali metals such as lithium (Li) and cesium (Cs); alkaline earth metals such as magnesium (Mg), calcium (Ca), and strontium (Sr); rare earth metals such as europium (Eu) and ytterbium (Yb); alkali metal compounds (including an oxide of lithium oxide, a halide, and carbonate such as lithium carbonate and cesium carbonate); alkaline earth metal compounds (including an oxide, a halide, and carbonate); rare earth metal compounds (including an oxide, a halide, and carbonate); and the like. These materials having a high electron-injection property are preferred because they are stable in the air, and therefore provide high productivity and are suitable for mass production.

The light-emitting element described in this embodiment includes a single layer of the above-described metal or a compound thereof as the electron-injection buffer layer 104. The thickness of the electron-injection buffer layer 104 is extremely thin (specifically, less than or equal to 1 nm) in order to avoid an increase in driving voltage. Note that in the case in which the electron-injection buffer layer 104 is formed over the electron-transport layer 108 after the electron-transport layer 108 is formed, a part of the material used for forming the electron-injection buffer layer 104 can also exist in the electron-transport layer 108 that is a part of the first EL layer 103. That is, the extremely thin electron-injection buffer layer 104 exists at the interface between the electron-relay layer 105 and the electron-transport layer 108 that is a part of the first EL layer 103. Note that in this embodiment, the electron-transport layer 108 in the first EL layer 103 is preferably formed in contact with the electron-injection buffer layer 104.

Figure 2B:
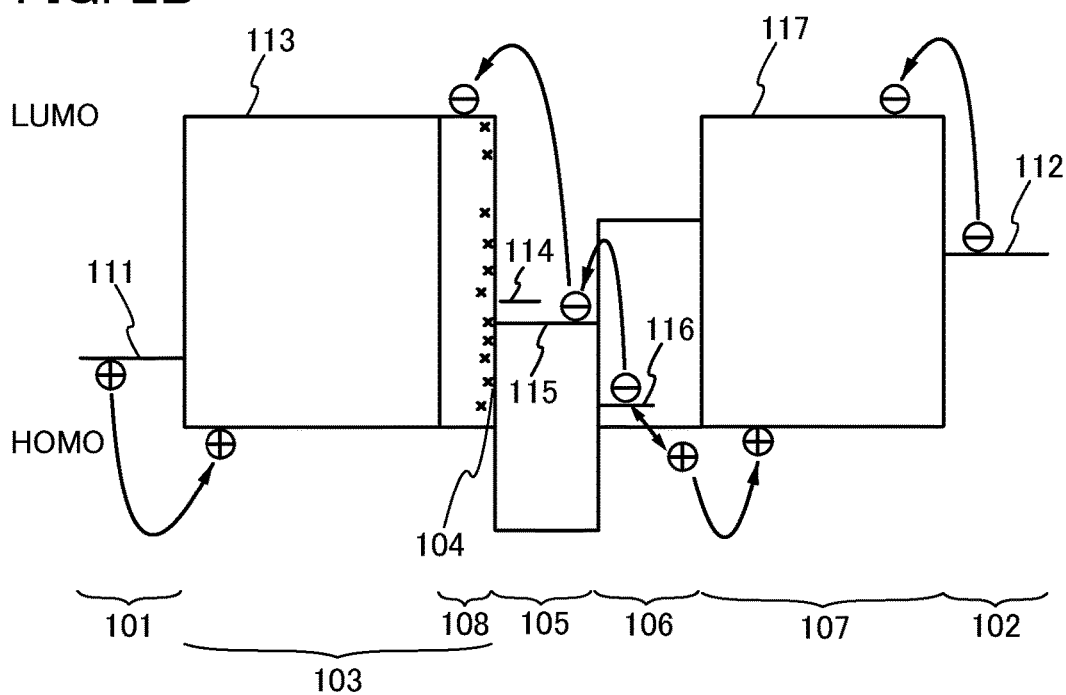

FIG. 2B illustrates a band diagram of the element structure illustrated in FIG. 2A. In FIG. 2B, the electron-injection buffer layer 104 at the interface between the electron-relay layer 105 and the first EL layer 103 (the electron-transport layer 108) can reduce the injection barrier between the charge-generation layer 106 and the first EL layer 103 (the electron-transport layer 108). Thus, electrons generated in the charge-generation layer 106 can easily be injected to the first EL layer 103.

Further, with the structure of the electron-injection buffer layer described in this embodiment, the driving voltage of the light-emitting element can be reduced more than with a structure of an electron-injection buffer layer described in Embodiment 3 (a layer that is formed by adding a donor material to an electron-transport material).

Note that the structure in this embodiment can be combined with any of the structures in other embodiments as appropriate.

Embodiment 3

In this embodiment, another example of a light-emitting element described in Embodiment 1 is described. Specifically, described is a case in which an electron-injection buffer layer 104 included in the light-emitting element described in Embodiment 1 contains an electron-transport material and a donor material, with reference to FIGS. 3A and 3B.

Figure 3A:
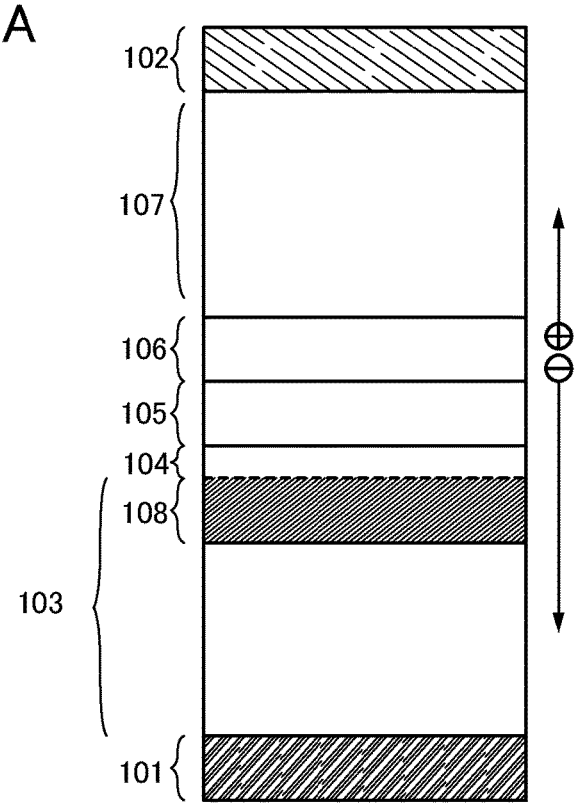
FIGS. 3A and 3B respectively illustrate an example of an element structure of a light-emitting element and an example of a band diagram of the light-emitting element described in Embodiment 3.

In a light-emitting element of this embodiment, as illustrated in FIG. 3A, a first EL layer 103 and a second EL layer 107 including a light-emitting region are interposed between a pair of electrodes (an anode 101 and a cathode 102). In addition, the light-emitting element includes, from the anode 101 side, the electron-injection buffer layer 104 in contact with the first EL layer 103, an electron-relay layer 105 in contact with the electron-injection buffer layer 104, and a charge-generation layer 106 in contact with the electron-relay layer 105 and the second EL layer 107.

The electron-injection buffer layer 104 contains an electron-transport material and a donor material. Note that in this embodiment, the donor material is preferably added so that the weight ratio of the donor material to the electron-transport material is from 0.001:1 to 0.1:1, in which case the electron-injection buffer layer 104 can have high film quality and high reactivity.

The anode 101, the cathode 102, the first EL layer 103, the electron-relay layer 105, the charge-generation layer 106, and the second EL layer 107 in this embodiment can be formed using materials similar to those described in Embodiment 1 can have structures similar to those described in Embodiment 1. Therefore, the description in Embodiment 1 is to be referred to.

In this embodiment, examples of the electron-transport material contained in the electron-injection buffer layer 104 include the following: a metal complex having a quinoline skeleton or a benzoquinoline skeleton, such as Alq, Almq$_3$, BeBq$_2$, and BAlq; a metal complex having an oxazole-based or thiazole-based ligand, such as Zn(BOX)$_2$ and Zn(BTZ)$_2$; PBD; OXD-7; CO11; TAZ; BPhen; BCP; and the like. Most of the substances listed here have an electron mobility of greater than or equal to $1 \times 10^{-6}$ cm$^2$/Vs.

In addition to the above substances, a high molecular compound such as PF-Py and PF-BPy can be given as the electron-transport material contained in the electron-injection buffer layer 104.

Further, in this embodiment, as the donor material contained in the electron-injection buffer layer 104, an alkali metal, an alkaline earth metal, a rare earth metal, a compound thereof (including an oxide, a halide, and a carbonate, or the like) can be used. Alternatively, an organic compound such as tetrathianaphthacene (abbreviation: TTN), nickelocene, or decamethylnickelocene can be used as the donor material contained in the electron-injection buffer layer 104.

Note that in this embodiment, the electron-transport layer 108 in the first EL layer 103 may be formed in contact with the electron-injection buffer layer 104. In the case in which the electron-transport layer 108 is formed in contact with the electron-injection buffer layer 104, an electron-transport material used for the electron-injection buffer layer 104 and an electron-transport material used for the electron-transport layer 108 that is a part of the first EL layer 103 may be the same or different.

As illustrated in FIG. 3A, the electron-injection buffer layer 104 containing the electron-transport material and the donor material is formed between the first EL layer 103 and the electron-relay layer 105, which is a feature of the light-emitting element described in this embodiment.

Figure 3B:
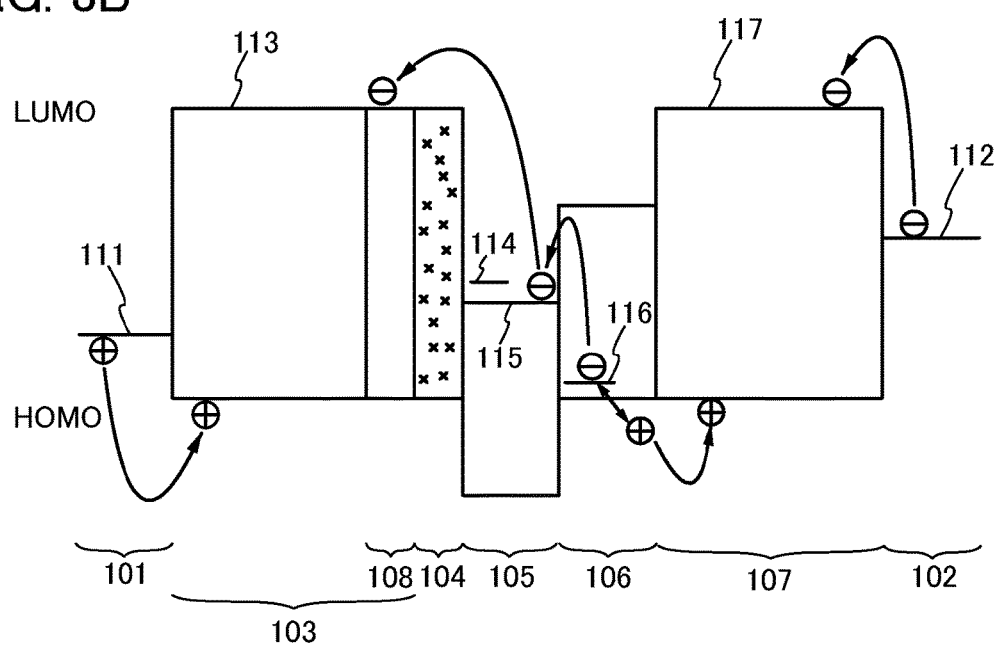

FIG. 3B illustrates a band diagram of the element structure illustrated in FIG. 3A. The electron-injection buffer layer 104 can reduce the injection barrier between the electron-relay layer 105 and the first EL layer 103 (the electron-transport layer 108). Thus, electrons generated in the charge-generation layer 106 can easily be injected to the first EL layer 103.

Note that the structure in this embodiment can be combined with any of the structures in other embodiments as appropriate.

Embodiment 4

In this embodiment, another example of a light-emitting element described in Embodiment 1 is described. Specifically, described is a structure of a charge-generation layer 106 in the light-emitting element described in Embodiment 1, with reference to FIGS. 4A and 4B.

Figure 4A:
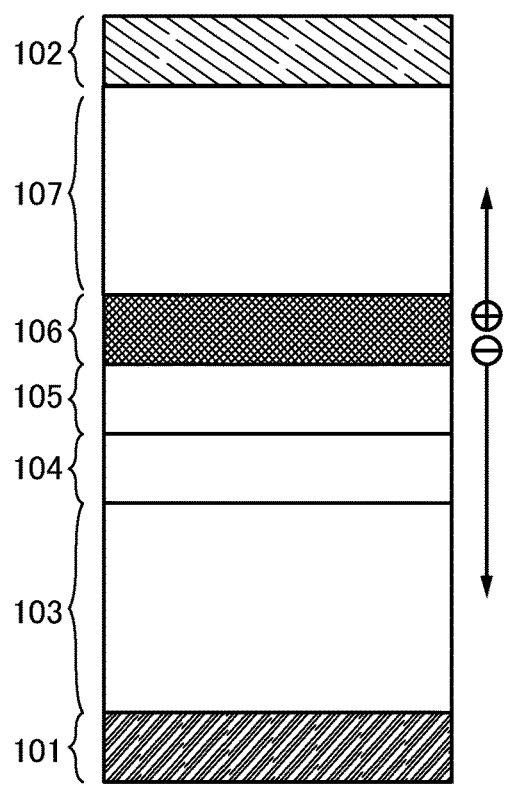
FIGS. 4A and 4B illustrate examples of an element structure of a light-emitting element described in Embodiment 4.
Figure 4B:
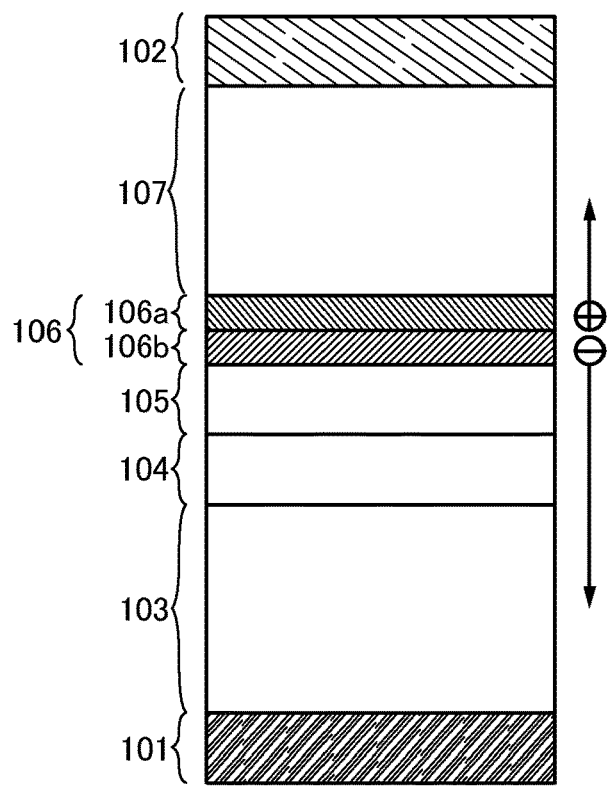

In a light-emitting element of this embodiment, as illustrated in FIGS. 4A and 4B, a first EL layer 103 and a second EL layer 107 including a light-emitting region are interposed between a pair of electrodes (an anode 101 and a cathode 102). In addition, the light-emitting element includes, from the anode 101 side, an electron-injection buffer layer 104 in contact with the first EL layer 103, an electron-relay layer 105 in contact with the electron-injection buffer layer 104, and the charge-generation layer 106 in contact with the electron-relay layer 105 and the second EL layer 107. In FIGS. 4A and 4B, the anode 101, the cathode 102, the first EL layer 103, the electron-injection buffer layer 104, the electron-relay layer 105, and the second EL layer 107 can be formed using materials similar to those described in Embodiments 1 to 3 and can have structures similar to those described in Embodiments 1 to 3. Therefore, the description in Embodiments 1 to 3 is to be referred to.

In the light-emitting element illustrated in FIGS. 4A and 4B, the charge-generation layer 106 contains a hole-transport material and an acceptor material. Note that in the charge-generation layer 106, electrons are drawn out from the hole-transport material by the acceptor material, whereby holes and electrons are generated.

The charge-generation layer 106 illustrated in FIG. 4A has a structure in which a hole-transport material and an acceptor material are contained in the same film. In this case, the acceptor material is preferably added so that the weight ratio of the acceptor material to the hole-transport material is from 0.1:1 to 4.0:1, in which case carriers are easily generated in the charge-generation layer 106.

In FIG. 4A, the hole-transport material is doped with the acceptor material, and thus an increase in driving voltage can be suppressed even when the thickness of the charge-generation layer 106 is increased. The suppression of an increase in driving voltage can lead to improvement of color purity by optical adjustment. In addition, the increase in the thickness of the charge-generation layer 106 can prevent short-circuiting of the light-emitting element.

In contrast, the charge-generation layer 106 illustrated in FIG. 4B has a structure in which a layer 106a containing a hole-transport material, which is in contact with the second EL layer 107, and a layer 106b containing an acceptor material, which is in contact with the electron-relay layer 105, are stacked. In the charge-generation layer 106 of the light-emitting element illustrated in FIG. 4B, as a result of donation of electrons by the hole-transport material and acceptance of electrons by the acceptor material, an electron transfer complex is formed only at the interface between the layer 106a containing the hole-transport material and the layer 106b containing the acceptor material. Thus, the light-emitting element illustrated in FIG. 4B is preferable because an absorption band in the visible light region is not easily formed even when the thickness of the charge-generation layer 106 is increased.

The hole-transport material contained in the charge-generation layer 106 can be any of a variety of organic compounds such as an aromatic amine compound, a carbazole derivative, an aromatic hydrocarbon, and a high molecular compound (e.g., an oligomer, a dendrimer, or a polymer).

Specific examples of the aromatic amine compound include NPB, TPD, TCTA, TDATA, MTDATA, DTDPPA, DPAB, DNTPD, DPA3B, and the like.

Specific examples of the carbazole derivative include PCzPCA1, PCzPCA2, PCzPCN1, and the like. In addition, CBP, TCPB, CzPA, 1,4-bis[4-(N-carbazolyl)phenyl]-2,3,5,6-tetraphenylbenzene, and the like can be given.

Specific examples of the aromatic hydrocarbon include t-BuDNA, DPPA, t-BuDBA, DNA, DPAnth, t-BuAnth, DMNA, 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene; tetracene; rubrene, perylene; 2,5,8,11-tetra(tert-butyl)perylene; and the like. Further, the aromatic hydrocarbon may have a vinyl skeleton. As the aromatic hydrocarbon having a vinyl group, for example, DPVBi, DPVPA, and the like can be given.

Further, a high molecular compound such as PVK or PVTPA can also be used as the hole-transport material.

The hole-transport material described above preferably has a hole mobility of greater than or equal to $1 \times 10^6$ cm$^2$/Vs. Note that any other material may also be used as long as it is a substance in which the hole-transport property is higher than the electron-transport property.

In the case of employing an evaporation method for formation of the above aromatic hydrocarbon, it is preferable that the number of carbon atoms that forms a condensed ring be 14 to 42 in terms of evaporativity at the time of evaporation or film quality after film formation.

As the acceptor material contained in the charge-generation layer 106, 7,7,8,8-tetracyano-2,3,5,6-tetrafluoroquinodimethane (abbreviation: F$_4$-TCNQ), chloranil, and the like can be given. Furthermore, as the acceptor material, a transition metal oxide can be given. In addition, oxides of metals belonging to Groups 4 to 8 of the periodic table can also be given. Specifically, vanadium oxide, niobium oxide, tantalum oxide, chromium oxide, molybdenum oxide, tungsten oxide, manganese oxide, and rhenium oxide are preferable because their electron-accepting property is high. Furthermore, molybdenum oxide is preferably used as the acceptor material. Note that molybdenum oxide has a feature of a low hygroscopic property.

Note that the structure in this embodiment can be combined with any of the structures in other embodiments as appropriate.

Embodiment 5

In this embodiment, another example of a light-emitting element described in Embodiment 1 is described. Specifically, described is an example of the light-emitting element described in Embodiment 1, with reference to FIGS. 5A and 5B.

Figure 5A:
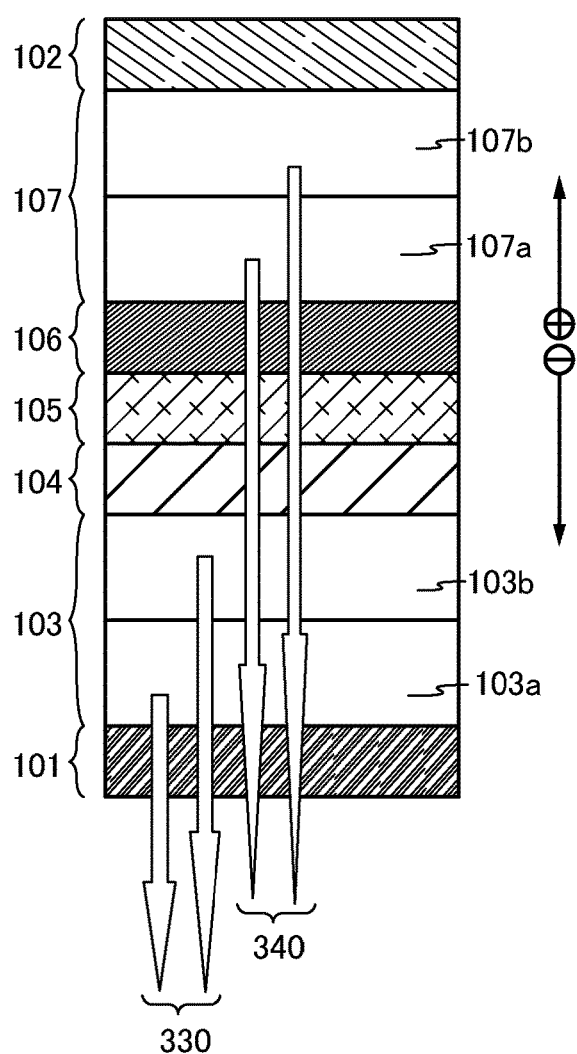
FIGS. 5A and 5B respectively illustrate an example of an element structure of a light-emitting element and emission spectra thereof described in Embodiment 5.

In a light-emitting element of this embodiment, as illustrated in FIG. 5A, a first EL layer 103 and a second EL layer 107 including a light-emitting region are interposed between a pair of electrodes (an anode 101 and a cathode 102). In addition, the light-emitting element includes, from the anode 101 side, an electron-injection buffer layer 104 in contact with the first EL layer 103, an electron-relay layer 105 in contact with the electron-injection buffer layer 104, and a charge-generation layer 106 in contact with the electron-relay layer 105 and the second EL layer 107.

The anode 101, the cathode 102, the electron-injection buffer layer 104, the electron-relay layer 105, and the charge-generation layer 106 in this embodiment can be formed using materials described in Embodiments 1 to 4 and can have structures described in Embodiments 1 to 4. Therefore, the description in Embodiments 1 to 4 is to be referred to.

In this embodiment, the first EL layer 103 includes a first light-emitting layer 103a which exhibits an emission spectrum having a peak in the blue to blue-green wavelength range and a second light-emitting layer 103b which exhibits an emission spectrum having a peak in the yellow to orange wavelength range. Further, the second EL layer 107 includes a third light-emitting layer 107a which exhibits an emission spectrum having a peak in the blue-green to green wavelength range and a fourth light-emitting layer 107b which exhibits an emission spectrum having a peak in the orange to red wavelength range. Note that the first light-emitting layer 103a and the second light-emitting layer 103b may be stacked in reverse order. Note also that the third light-emitting layer 107a and the fourth light-emitting layer 107b may be stacked in reverse order.

When the anode 101 side is positively biased and the cathode 102 side is negatively biased in such a light-emitting element, holes injected from the anode 101 and electrons generated in the charge-generation layer 106 and injected through the electron-relay layer 105 and the electron-injection buffer layer 104 recombine in the first light-emitting layer 103a or the second light-emitting layer 103b, whereby first light emission 330 is performed. Furthermore, electrons injected from the cathode 102 and holes generated in the charge-generation layer 106 and injected recombine in the third light-emitting layer 107a or the fourth light-emitting layer 107b, whereby second light emission 340 is performed.

Figure 5B:
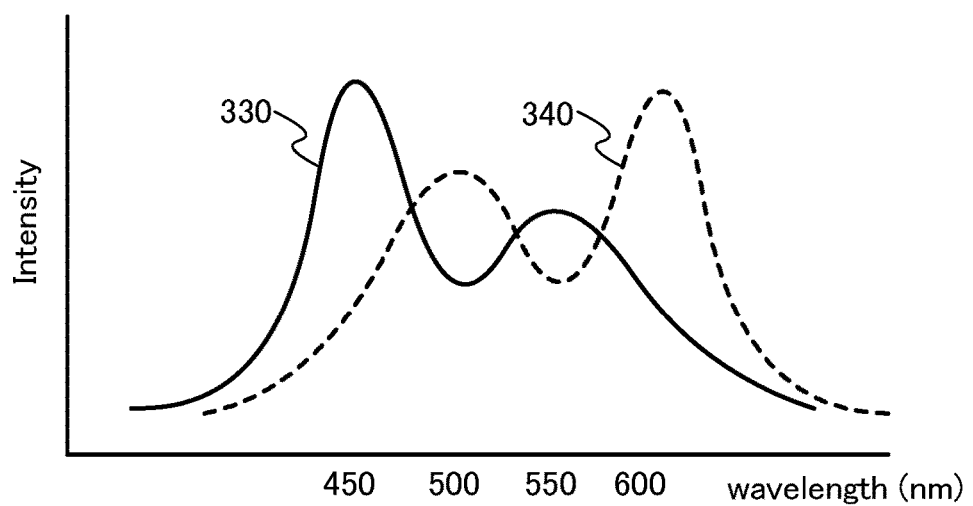

FIG. 5B schematically shows emission spectra of the first light emission 330 and the second light emission 340. The first light emission 330 is a combination of light emission from both the first light-emitting layer 103a and the second light-emitting layer 103b; thus, the first light emission 330 exhibits an emission spectrum having peaks in both the blue to blue-green wavelength range and the yellow to orange wavelength range. That is, the first EL layer 103 exhibits light emission of a two-wavelength-type white color or a color close to white. Further, the second light emission 340 is a combination of light emission from both the third light-emitting layer 107a and the fourth light-emitting layer 107b; thus, the second light emission 340 exhibits an emission spectrum having peaks in both the blue-green to green wavelength range and the orange to red wavelength range. That is, the second EL layer 107 exhibits light emission of two-wavelength-type white color or a color close to white, which is different from the light emission of the first EL layer 103.

As a result of combining the first light emission 330 and the second light emission 340, light emission which covers the blue to blue-green wavelength range, the blue-green to green wavelength range, the yellow to orange wavelength range, and the orange to red wavelength range is obtained with the light-emitting element in this embodiment.

Because the contribution of the first light-emitting layer 103a with respect to the entire emission spectrum is approximately one quarter, for example, even in the case in which the luminance of the first light-emitting layer 103a (which exhibits an emission spectrum having a peak in the blue to blue-green wavelength range) deteriorates over time or changes due to current density, deviation of chromaticity is relatively small.

Although the example has been described in which the first EL layer 103 exhibits the emission spectrum having peaks in both the blue to blue-green wavelength range and the yellow to orange wavelength range, and the second EL layer 107 exhibits the emission spectrum having peaks in both the blue-green to green wavelength range and the orange to red wavelength range, the first EL layer 103 and the second EL layer 107 each may exhibit the opposite emission spectrum. In other words, a structure may be employed in which the second EL layer 107 exhibits the emission spectrum having peaks in both the blue to blue-green wavelength range and the yellow to orange wavelength range, and the first EL layer 103 exhibits the emission spectrum having peaks in both the blue-green to green wavelength range and the orange to red wavelength range. Alternatively, the first EL layer 103 and the second EL layer 107 may independently have a structure in which layers other than the light-emitting layer are stacked.

Next, materials that can be used as a light-emitting organic compound for the EL layer of the light-emitting element described in this embodiment are described. However, materials that can be applied to the light-emitting element described in this embodiment are not limited to those given below.

Blue to blue-green light emission can be obtained, for example, by using perylene, TBP, 9,10-diphenylanthracene, or the like as a guest material, and dispersing the guest material in a suitable host material. Alternatively, the blue to blue-green light emission can be obtained from a styrylarylene derivative such as DPVBi, or an anthracene derivative such as DNA or t-BuDNA. Further alternatively, a polymer such as poly(9,9-dioctylfluolene) may be used. Further, as a guest material for blue light emission, a styrylamine derivative is given such as YGA2S and N,N'-diphenyl-N,N'-bis(9-phenyl-9H-carbazol-3-yl)stilbene-4,4'-diamine (abbreviation: PCA2S). In particular, YGA2S is preferable because it has a peak near 450 nm. Further, as a host material, an anthracene derivative is preferable; t-BuDNA and CzPA are suitable. In particular, CzPA is preferable because it is electrochemically stable.

Blue-green to green light emission can be obtained, for example, by using a coumarin dye such as coumarin 30 or coumarin 6; FIrpic; Ir(ppy)$_2$(acac); or the like as a guest material and dispersing the guest material in a suitable host material. Alternatively, the blue-green to green light emission can be obtained from a metal complex such as BAlq, Zn(BTZ)$_2$, or bis(2-methyl-8-quinolinolato)chlorogallium (Ga(mq)$_2$CL). Further, a polymer such as poly(p-phenylenevinylene) may be used. Alternatively, the blue-green to green light emission can be obtained by dispersing perylene or TBP given above in an appropriate host material at a high concentration of greater than or equal to 5 wt %. Further, an anthracene derivative is preferably used as a guest material of a blue-green to green light-emitting layer, in which case high emission efficiency can be obtained. For example, when DPABPA is used, highly efficient blue-green light emission can be obtained. Further, an anthracene derivative in which an amino group has been substituted into the 2-position is preferably used, in which case highly efficient green light emission can be obtained. In particular, 2PCAPA is suitable because it has a long lifetime. As a host material for those materials, an anthracene derivative is preferable; CzPA, which is given above, is preferable because it is electrochemically stable. Further, in the case of manufacturing a light-emitting element in which green light emission and blue light emission are combined and which has two peaks in the blue to green wavelength range, an anthracene derivative having an electron-transport property, such as CzPA is preferably used as a host material for a blue light-emitting layer and an aromatic amine compound having a hole-transport property, such as NPB is preferably used as a host material for a green light-emitting layer, in which case light emission can be obtained at an interface between the blue light-emitting layer and the green light-emitting layer. In other words, in such a case, an aromatic amine compound like NPB is preferable as a host material for a green light-emitting material such as 2PCAPA.

Yellow to orange light emission can be obtained, for example, by using rubrene, DCM1, DCM2, bis[2-(2-thienyl) pyridinato]acetylacetonatoiridium (abbreviation: Ir(thp)$_2$ (acac)), bis(2-phenylquinolinato)acetylacetonatoiridium (abbreviation: Ir(pq)$_2$(acac)), or the like as a guest material and dispersing the guest material in a suitable host material. In particular, a tetracene derivative such as rubrene is preferable as a guest material because it is highly efficient and chemically stable. As a host material in that case, an aromatic amine compound such as NPB is preferable. Alternatively, a metal complex such as bis(8-quinolinolato)zinc (abbreviation: Znq$_2$) or bis[2-cinnamoyl-8-quinolinolato] zinc (abbreviation: Znsq$_2$) can be used as a host material. Further alternatively, a polymer such as poly(2,5-dialkoxy-1,4-phenylenevinylene) may be used.

Orange to red light emission can be obtained, for example, by using BisDCM, 4-(dicyanomethylene)-2,6-bis [2-(julolidin-9-yl)ethenyl]-4H-pyran (abbreviation: DCM1), 2-{2-methyl-6-[2-(2,3,6,7-tetrahydro-1H,5H-benzo[ij]qui-nolizin-9-yl)ethenyl]-4H-pyran-4-ylidene}propanedinitrile (abbreviation: DCM2), Ir(thp)$_2$(acac), or the like as a guest material and dispersing the guest material in a suitable host material. Alternatively, the orange to red light emission can be obtained from a metal complex such as Znq$_2$ or Znsq$_2$. Further alternatively, a polymer such as poly(3-alkylthiophene) may be used. As a guest material which exhibits red light emission, a 4H-pyran derivative such as BisDCM, DCM2, DCJTI, or BisDCJTM is preferable because it is highly efficient. In particular, DCJTI and BisDCJTM are preferable because they have a light emission peak at approximately 620 nm.

As the appropriate host material in the above-described structures, a host material which has an emission color of a shorter wavelength than the light-emitting organic compound or a host material which has a large energy gap may be used. Specifically, a hole-transport material or an electron-transport material typified by the examples given in Embodiment 1 can be selected as appropriate. Alternatively, CBP, TCTA, TCPB, or the like may be used.

As a result of combining the emission spectrum of the first EL layer and the emission spectrum of the second EL layer, white light emission which covers the blue to blue-green wavelength range, the blue-green to green wavelength range, the yellow to orange wavelength range, and the orange to red wavelength range is obtained with the light-emitting element described in this embodiment.

Note that emitted light may be closer to natural light having a continuous spectrum in such a manner that slight interference of light is intentionally caused by adjustment of the film thickness of each stacked layer so that generation of an extremely sharp peak is suppressed and a trapezoidal emission spectrum is formed. In addition, the slight interference of light which is intentionally generated by adjustment of the film thickness of each stacked layer can also change the position of a peak of an emission spectrum. By adjusting the thickness of each stacked layer so that a plurality of peak intensities which appear in an emission spectrum are made roughly the same and by decreasing the intervals between the peaks, white light emission having an emission spectrum which is closer to a trapezoidal shape can be performed.

Note that in this embodiment, the EL layer in which the plural light-emitting layers exhibit complementary emission colors and these colors are combined to provide white emission is described. A specific structure of an EL layer which exhibits white light emission using the relation of complementary colors is described below.

The EL layer provided for the light-emitting element described in this embodiment has a structure in which, for example, a first layer containing a hole-transport material and a first light-emitting material; a second layer containing a hole-transport material and a second light-emitting material; and a third layer containing an electron-transport material and the second light-emitting material are stacked in this order from an anode 101 side.

Both the first light-emitting material and the second light-emitting material should emit light in order that white light emission is performed in the EL layers of the light-emitting element described in this embodiment. For that reason, both the hole-transport material and the electron-transport material are preferably used as host materials in order to adjust the transporting properties of carriers in the EL layers. Note that as the hole-transport material or the electron-transport material which can be used for the EL layers, the materials given as examples in Embodiment 1 can be used as appropriate.

Further, as the first light-emitting material and the second light-emitting material, materials which emit complementary colors can be selected and used. Examples of the complementary colors are blue and yellow, blue green and red, and the like. A material which emits blue, yellow, blue-green, or red light may be selected as appropriate from, for example, the light-emitting materials given above. Note that with the second light-emitting material which has a shorter emission wavelength than the first light-emitting material, part of excitation energy of the second light-emitting material is transferred to the first light-emitting material, so that the first light-emitting material can emit light. For the above reason, in the light-emitting element of this embodiment, the emission peak wavelength of the second light-emitting material is preferably shorter than the emission peak wavelength of the first light-emitting material.

In the structure of the light-emitting element described in this embodiment, both light emission from the first light-emitting material and light emission from the second light-emitting material can be obtained, and the emission color of the first light-emitting material and the emission color of the second light-emitting material are complementary colors, and accordingly white light emission can be obtained. In addition, a light-emitting element with a long lifetime can be obtained with the structure of the light-emitting element described in this embodiment.

Note that the structure in this embodiment can be combined with any of the structures in other embodiments as appropriate.

Embodiment 6

Figure 6A:
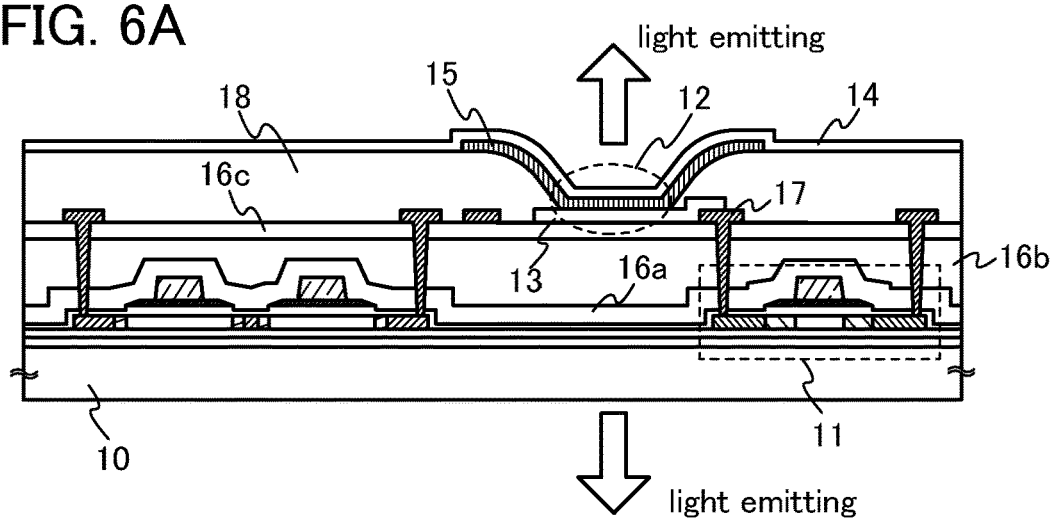
FIGS. 6A to 6C illustrate active-matrix light-emitting devices described in Embodiment 6.
Figure 6B:
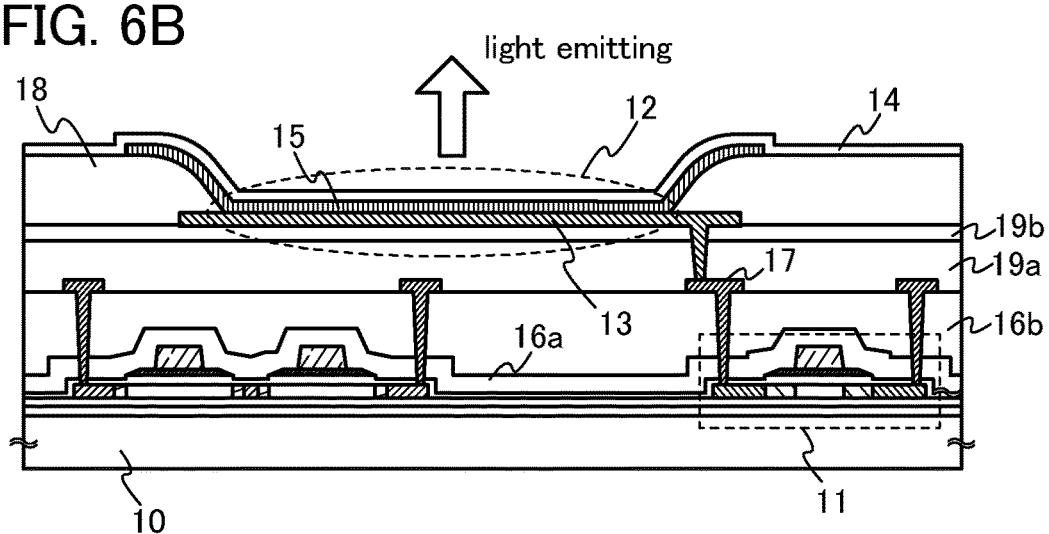
Figure 6C:
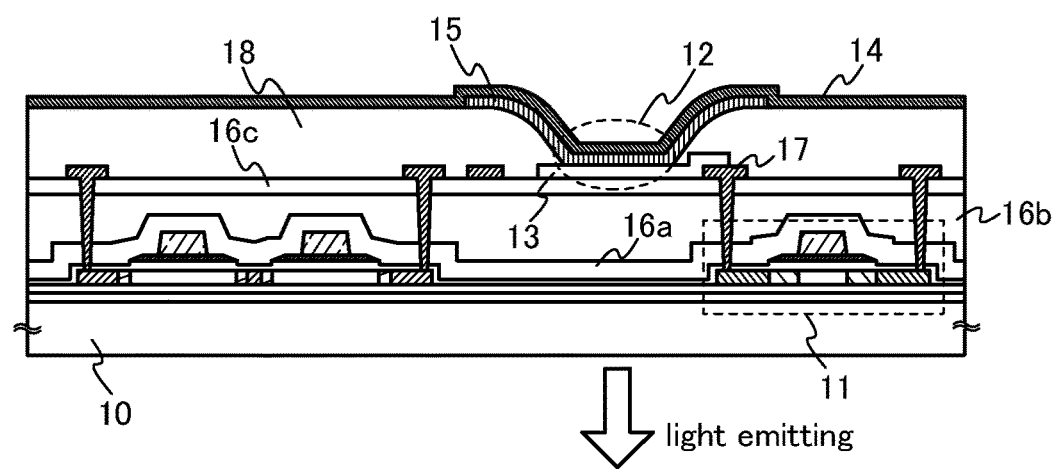

In this embodiment, modes of light-emitting devices each including the light-emitting element described in any of Embodiments 1 to 5 are described with reference to FIGS. 6A to 6C. FIGS. 6A to 6C are cross-sectional views of the light-emitting devices.

In FIGS. 6A to 6C, the light-emitting devices in this embodiment include a substrate 10, a light-emitting element 12 and a transistor 11 which are provided over the substrate 10. The light-emitting element 12 includes a layer 15 containing an organic compound between a first electrode 13 and a second electrode 14. The layer 15 containing an organic compound includes n EL layers (n is a natural number of two or more), and also includes, between m-th EL layer and (m+1)-th EL layer (m is a natural number, 1≤m≤n−1), an electron-injection buffer layer in contact with the m-th EL layer, an electron-relay layer in contact with the electron-injection buffer layer, and a charge-generation layer in contact with the electron-relay layer and the (m+1)-th EL layer. Further, in a structure of each of the EL layers, at least a light-emitting layer is provided, and in addition to the light-emitting layer, a hole-injection layer, a hole-transport layer, an electron-transport layer, or an electron-injection layer is provided as appropriate. That is, the light-emitting element 12 is the light-emitting element described in any of Embodiments 1 to 5. A drain region of the transistor 11 is electrically connected to a first electrode 13 by a wiring 17 penetrating first interlayer insulating films 16a, 16b, and 16c. The light-emitting element 12 is separated from other adjacently-provided light-emitting elements by partition layers 18.

The transistor 11 illustrated in each of FIGS. 6A to 6C is a top-gate type transistor in which a gate electrode is provided on a side opposite to the substrate with a semiconductor layer interposed between the substrate and the gate electrode. However, there is no particular limitation on the structure of the transistor 11; for example, the transistor 11 may be of bottom-gate type. In the case of a bottom-gate type, the transistor 11 may have a structure in which a protective film is formed over the semiconductor layer used to form a channel (a channel protective type) or a structure in which part of the semiconductor layer used to form a channel has a depression (a channel etch type).

The semiconductor layer for forming the transistor 11 may be formed using any material as long as the material exhibits semiconductor characteristics; for example, an element belonging to Group 14 of the periodic table such as silicon (Si) and germanium (Ge), a compound such as gallium arsenide and indium phosphide, an oxide such as zinc oxide and tin oxide, and the like can be given. Further, the semiconductor layer may be either crystalline or non-crystalline.

For the oxide exhibiting semiconductor characteristics (an oxide semiconductor), composite oxide of an element selected from indium, gallium, aluminum, zinc, and tin can be used. For example, zinc oxide (ZnO), indium oxide containing zinc oxide (IZO: indium zinc oxide), and oxide containing indium oxide, gallium oxide, and zinc oxide (IGZO: indium gallium zinc oxide) can be given. As specific examples of the material for the crystalline semiconductor layer, a single crystal semiconductor, a polycrystalline semiconductor, and a microcrystalline semiconductor can be given. Such a semiconductor layer may be formed by laser crystallization or may be formed by crystallization through a solid-phase growth method using, for example, nickel.

Note that the microcrystalline semiconductor in this specification belongs to a metastable state which is intermediate between an amorphous state and a single crystal state when Gibbs free energy is considered. That is, the microcrystalline semiconductor has a third state which is stable in terms of free energy and has a short range order and lattice distortion. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, microcrystalline silicon contains hydrogen or halogen of at least 1 atomic percent or more in order to terminate a dangling bond. Moreover, with addition of a rare gas element such as helium, argon, krypton, or neon in order to further promote lattice distortion, stability is enhanced and a favorable microcrystalline semiconductor layer can be formed.

In the case in which the semiconductor layer is formed using an amorphous material, for example, amorphous silicon, it is preferable that the light-emitting device have a circuit in which the transistor 11 and other transistors (transistors constituting a circuit for driving the light-emitting element) are all n-channel transistors because the manufacturing process of the light-emitting device is simplified. Further, zinc oxide (ZnO), indium oxide containing zinc oxide (IZO), oxide containing indium oxide, gallium oxide, and zinc oxide (IGZO), and the like are n-type semiconductors; thus, a transistor in which any of those oxides is contained in a semiconductor layer is of n-channel type. The light-emitting device may have a circuit including either an n-channel transistor or a p-channel transistor, or may have a circuit including both an n-channel transistor and a p-channel transistor.

The first interlayer insulating films 16a to 16c may have a multilayer structure as illustrated in FIGS. 6A and 6C, or may have a single layer structure. Note that the first interlayer insulating film 16a is formed of an inorganic material such as silicon oxide or silicon nitride; the first interlayer insulating film 16b is formed of acrylic, siloxane (an organic group including a skeleton structure of a bond of silicon (Si) and oxygen (O) and containing at least hydrogen as a substituent) or a self-planarizing material which can be formed as a film by an application method, such as silicon oxide. In addition, the first interlayer insulating film 16c is formed of a silicon nitride film containing argon (Ar). Note that there is no particular limitation on the material forming each layer, and a material other than the above materials may also be used. A layer formed using a material other than the above materials may be further combined. As described above, the first interlayer insulating films 16a to 16c may be formed using either an inorganic material or an organic material, or both of them.

As for the partition layer 18, the radius of curvature of the edge portion preferably changes continuously. In addition, the partition layer 18 can be formed using acrylic, siloxane, silicon oxide, or the like. Note that the partition layer 18 may be formed using either an inorganic material or an organic material, or both of them.

Although the structure in which only the first interlayer insulating films 16a to 16c are provided between the transistor 11 and the light-emitting element 12 is illustrated in each of FIGS. 6A and 6C, in addition to the first interlayer insulating films 16a to 16c, second interlayer insulating films 19a and 19b may be provided as illustrated in FIG. 6B. In the light-emitting device illustrated in FIG. 6B, the first electrode 13 penetrates the second interlayer insulating films 19a and 19b to be electrically connected to the wiring 17.

The second interlayer insulating films 19a and 19b may have a multilayer structure or may have a single layer structure in a manner similar to that of the first interlayer insulating films 16a to 16c. The second interlayer insulating film 19a is formed of acrylic, siloxane, or a self-planarizing material which can be formed as a film by an application method, such as silicon oxide. The second interlayer insulating film 19b is formed of a silicon nitride film containing argon (Ar). Note that there is no particular limitation on the material forming each layer, and a material other than the above materials may also be used. A layer formed of a material other than the above materials may be further combined. As described above, the second interlayer insulating films 19a and 19b may be formed using either an inorganic material or an organic material, or both of them.

In the case in which both the first electrode 13 and the second electrode 14 in the light-emitting element 12 are formed using a light-transmitting material, emitted light can be extracted from both the first electrode 13 and the second electrode 14 as indicated by the outline arrows in FIG. 6A. In addition, in the case in which only the second electrode 14 is formed using a light-transmitting material, emitted light can be extracted from only the second electrode 14 as indicated by the outline arrow in FIG. 6B. In that case, it is preferable that the first electrode 13 be formed using a material having high reflectivity, or that a film formed using a material having high reflectivity (a reflective film) be provided under the first electrode 13. Furthermore, in the case in which only the first electrode 13 is formed using a light-transmitting material, emitted light can be extracted from only the first electrode 13 as indicated by the outline arrow in FIG. 6C. In that case, it is preferable that the second electrode 14 be formed using a material having high reflectivity, or that a reflective film be formed above the second electrode 14.

Further, in the light-emitting element 12, the layer 15 containing an organic compound may be stacked so that the light-emitting element 12 operates when a voltage is applied such that the potential of the second electrode 14 becomes higher than that of the first electrode 13, or such that the potential of the second electrode 14 becomes lower than that of the first electrode 13. In the former case, the first electrode 13 is an anode, the second electrode 14 is a cathode, and the transistor 11 is an n-channel transistor; in the latter case, the first electrode 13 is a cathode, the second electrode 14 is an anode, and the transistor 11 is a p-channel transistor.

Figure 7A:
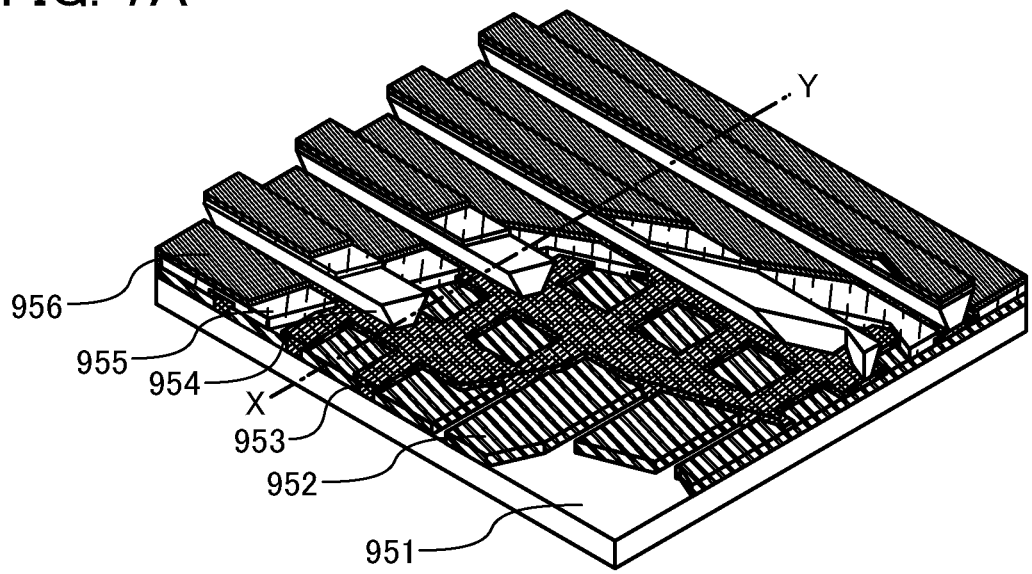
FIGS. 7A and 7B illustrate a passive-matrix light-emitting device described in Embodiment 6.

In this embodiment, an active-matrix light-emitting device in which driving of a light-emitting element is controlled by a transistor is described. In addition, a passive-matrix light-emitting device in which a light-emitting element is driven without provision of an element for driving a transistor or the like on the substrate over which the light-emitting element is formed may be manufactured. FIG. 7A is a perspective view of a passive-matrix light-emitting device manufactured by application of the light-emitting element described in any of Embodiments 1 to 5. In addition, FIG. 7B is a cross-sectional view taken along dashed line X-Y of FIG. 7A.

Figure 7B:
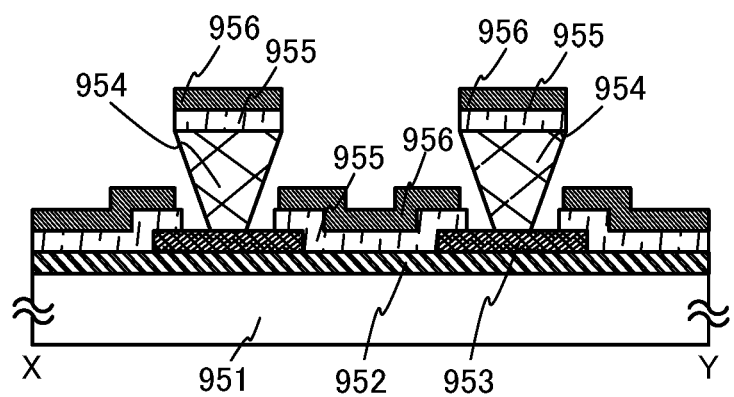

In FIGS. 7A and 7B, a light-emitting element 955 is provided between an electrode 952 and an electrode 956 over a substrate 951. The light-emitting element 955 is the light-emitting element described in any of Embodiments 1 to 5. End portions of the electrode 952 are covered with an insulating layer 953. Then, a partition layer 954 is provided over the insulating layer 953. The partition layer 954 preferably has tapered side surfaces with such a slope that the distance between opposite side surfaces decreases toward the substrate surface. That is, a cross section of the partition layer 954 in the direction of a narrow side is trapezoidal, and a base (a side facing in a direction similar to a plane direction of the insulating layer 953 and being in contact with the insulating layer 953) is shorter than an upper side (a side facing in a direction similar to the plane direction of the insulating layer 953 and not being in contact with the insulating layer 953). The partition layer 954 as described above can prevent a defect of the light-emitting element due to static electricity or the like. The passive-matrix light-emitting device can also be driven with low power consumption when it includes the light-emitting element described in any of Embodiments 1 to 5.

The light-emitting element described as an example in any of Embodiments 1 to 5 is used in the light-emitting device described in this embodiment; thus, the light-emitting device can have a high luminance, can be driven at a low voltage, and consumes less power.

Embodiment 7

In this embodiment, described are electronic devices including the light-emitting devices examples of which are described in Embodiment 6.

As examples of the electronic devices of this embodiment, the following can be given: televisions, cameras such as video cameras and digital cameras, goggle type displays, navigation systems, computers, game machines, portable information terminals (e.g., mobile computers, cellular phones, portable game machines, and electronic book readers), image replay devices in which a recording medium is provided (specifically, devices that are capable of replaying recording media such as digital versatile discs (DVDs) and equipped with a display portion that can display an image), and the like. Specific examples of these electronic devices are illustrated in FIGS. 8A to 8E.

Figure 8A:
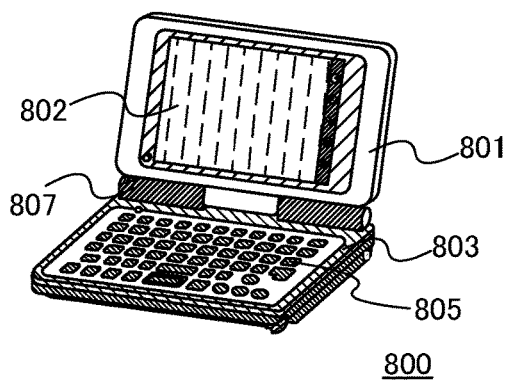
FIGS. 8A to 8E illustrate electronic devices described in Embodiment 7.

FIG. 8A illustrates an example of a portable information terminal device 800. The portable information terminal device 800 incorporates a computer and therefore can process a variety of types of data. As an example of the portable information terminal device 800, a personal digital assistant (PDA) can be given.

The portable information terminal device 800 has two housings: a housing 801 and a housing 803. The housing 801 and the housing 803 are joined with a joining portion 807 such that the portable information terminal device 800 can be foldable. A display portion 802 is incorporated in the housing 801, and the housing 803 is provided with a keyboard 805. Needless to say, the structure of the portable information terminal device 800 is not limited to the one described above, and the portable information terminal device 800 may be provided with other accessories as appropriate. In the display portion 802, light-emitting elements similar to those described in any of Embodiments 1 to 5 are arranged in matrix. The light-emitting elements have features of a high luminance, low driving voltage, and low power consumption. The display portion 802 including those light-emitting elements has similar features; therefore, low power consumption of this portable information terminal device can be achieved.

Figure 8B:
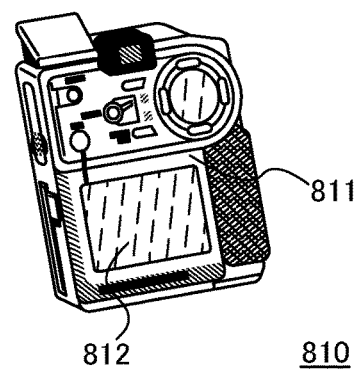

FIG. 8B illustrates an example of a digital video camera 810 of this embodiment. The digital video camera 810 includes a display portion 812 incorporated in a housing 811 and various operation portions. Note that there is no particular limitation on the structure of the digital video camera 810, and the digital video camera 810 may be provided with other accessories as appropriate.

In this digital video camera 810, the display portion 812 includes light-emitting elements similar to those described in any of Embodiments 1 to 5, which are arranged in matrix. The light-emitting elements have features of low driving voltage, a high luminance, and low power consumption. The display portion 812 including those light-emitting elements has similar features; therefore, low power consumption of this digital video camera 810 can be achieved.

Figure 8C:
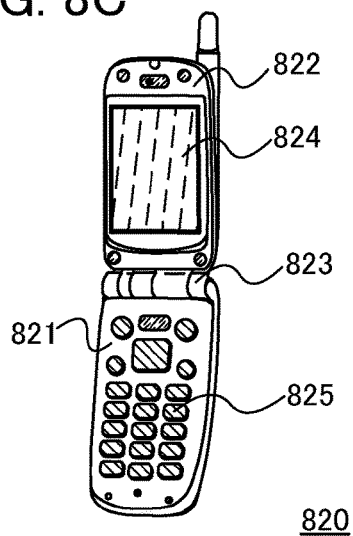

FIG. 8C illustrates an example of a cellular phone 820 of this embodiment. The cellular phone 820 has two housings: a housing 821 and a housing 822. The housing 821 and the housing 822 are joined with a joining portion 823 such that the cellular phone can be foldable. A display portion 824 is incorporated in the housing 822, and the housing 821 is provided with operation keys 825. Note that there is no particular limitation on the structure of the cellular phone 820, and the cellular phone 820 may be provided with other accessories as appropriate.

In the cellular phone 820, the display portion 824 includes light-emitting elements similar to those described in any of Embodiments 1 to 5, which are arranged in matrix. The light-emitting elements have features of a high luminance, low driving voltage, and low power consumption. The display portion 824 including those light-emitting elements has similar features; therefore, low power consumption of this cellular phone can be achieved. As a backlight of a display provided for a cellular phone or the like, the light-emitting element described in any of the above embodiments may be used.

Figure 8D:
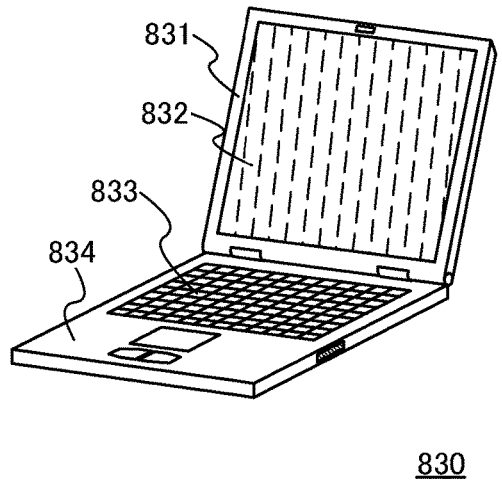

FIG. 8D illustrates an example of a portable computer 830. The computer 830 has two housings: a housing 831 and a housing 834 that are joined such that the computer 830 can be opened and closed. A display portion 832 is incorporated in the housing 831, and the housing 834 is provided with a keyboard 833 and the like. Note that there is no particular limitation on the structure of the computer 830, and the computer 830 may be provided with other accessories as appropriate.

In this computer 830, the display portion 832 includes light-emitting elements similar to those described in the any of Embodiments 1 to 5, which are arranged in matrix. The light-emitting elements have features of a high luminance, low driving voltage, and low power consumption. The display portion 832 including those light-emitting elements has similar features; therefore, low power consumption of this computer can be achieved.

Figure 8E:
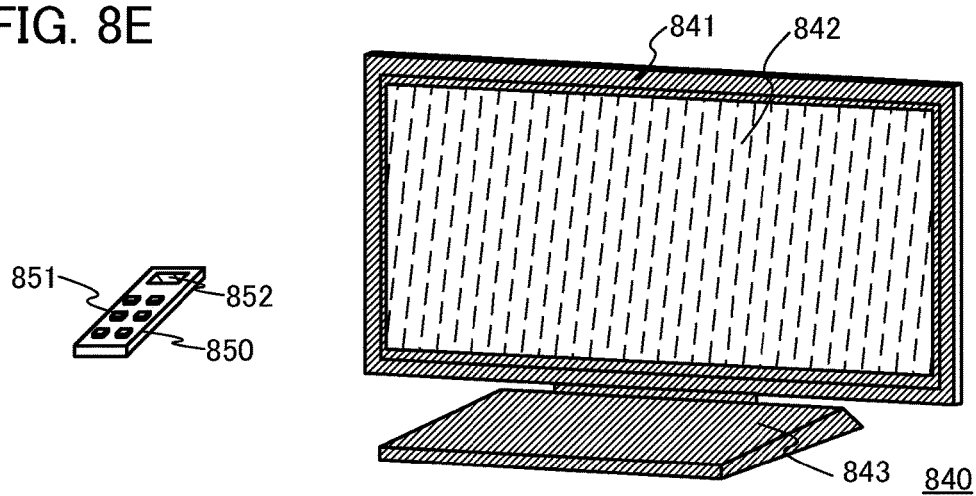

FIG. 8E illustrates an example of a television set 840. In the television set 840, a display portion 842 is incorporated in a housing 841. The display portion 842 can display images. Here, the housing 841 is supported by a stand 843.

The television set 840 can be operated with an operation switch (not illustrated) of the housing 841 or a separate remote controller 850. Channels can be selected and volume can be controlled with an operation key 851 of the remote controller 850, so that images displayed on the display portion 842 can be controlled. Furthermore, the remote controller 850 may be provided with a display portion 852 for displaying information outputted from the remote controller 850.

Note that the television set 840 is provided with a receiver, a modem, and the like. With the use of the receiver, a general television broadcast can be received. Moreover, when the television set is connected to a communication network with or without wires via the modem, one-way (from a sender to a receiver) or two-way (between a sender and a receiver or between receivers) information communication can be performed.

In at least either the display portion 842 or the display portion 852 of the television set 840, light-emitting elements similar to those described in any of Embodiments 1 to 5 are arranged in matrix. The light-emitting elements have features of a high luminance, low driving voltage, and low power consumption. The display portion including those light-emitting elements also has similar features.

As described above, the application range of the light-emitting device is so wide that this light-emitting device can be applied to electronic devices in all fields. With use of the light-emitting devices including the light-emitting elements described in Embodiments 1 to 5, an electronic device having a low-power-consumption display portion which exhibits high luminance light emission can be provided.

Embodiment 8

In this embodiment, described are lighting devices including the light-emitting device examples of which are described in Embodiment 6.

Figure 9:
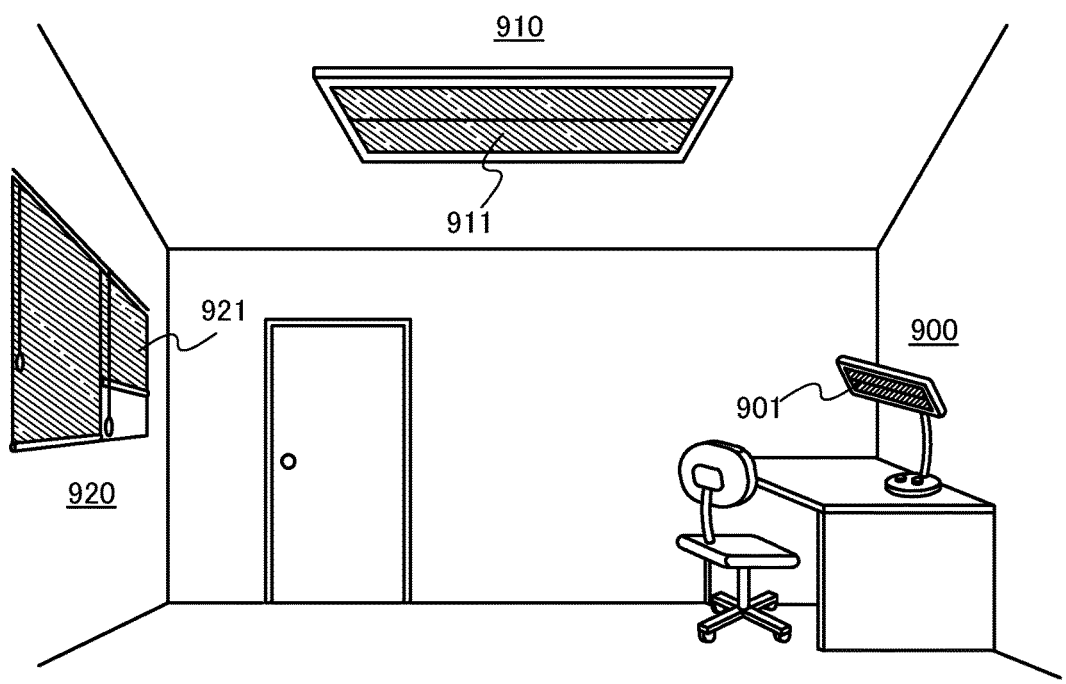
FIG. 9 illustrates lighting devices described in Embodiment 8.

FIG. 9 illustrates indoor lighting devices. A desk lighting device 900 in FIG. 9 includes a lighting portion 901. In the lighting portion 901, the light-emitting elements described in any of Embodiments 1 to 5 are used. The light-emitting elements have features of a high luminance, low driving voltage, and low power consumption. The lighting portion 901 including those light-emitting elements has similar features; thus, low power consumption of the desk lighting device 900 can be achieved. Since this light-emitting element can have a larger area, the light-emitting element can be applied to a lighting portion 911 of a ceiling lighting device 910. Moreover, this light-emitting element can be flexible and therefore can be applied to a lighting portion 921 of a roll-type lighting device 920.

Figure 10A:
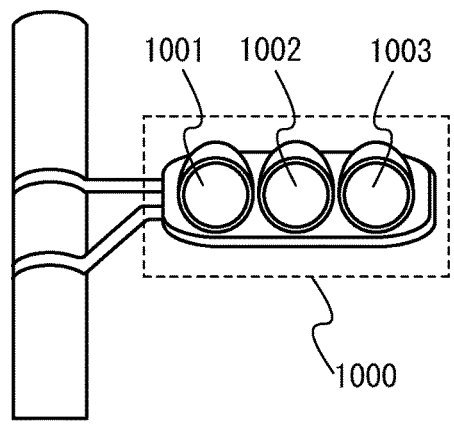
FIGS. 10A to 10E illustrate lighting devices described in Embodiment 8.

FIG. 10A illustrates a traffic light. A traffic light 1000 includes a green lighting portion 1001, an amber lighting portion 1002, and a red lighting portion 1003. The traffic light 1000 includes the light-emitting element described in any of Embodiments 1 to 5 in at least one of the lighting portions corresponding to green, amber, and red. The light-emitting elements have features of a high luminance, low driving voltage, and low power consumption. The lighting portions corresponding to green, amber, or red which includes those light-emitting elements have similar features; thus, low power consumption of this traffic light can be achieved.

Figure 10B:
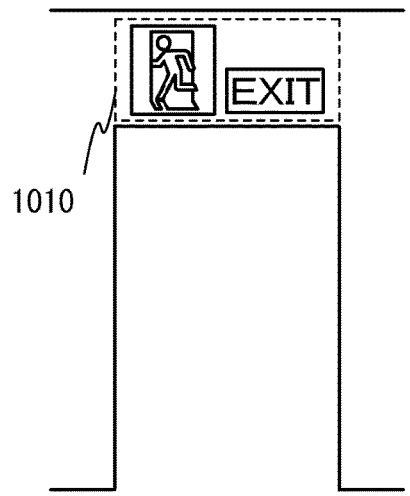

FIG. 10B illustrates an emergency exit light. An emergency exit light 1010 can be formed with combination of a lighting portion and a fluorescent plate provided with a fluorescent portion. The emergency exit light 1010 can also be formed with combination of a lighting portion emitting a specific light and a light-shielding plate provided with a transmitting portion having a shape illustrated in FIG. 10B. In the lighting portion of the emergency exit light 1010, the light-emitting elements described in any of Embodiments 1 to 5 are used. The light-emitting elements have features of a high luminance, low driving voltage, and low power consumption. The lighting portion including those light-emitting elements has similar features; therefore, low power consumption of this emergency exit light can be achieved.

Figure 10C:
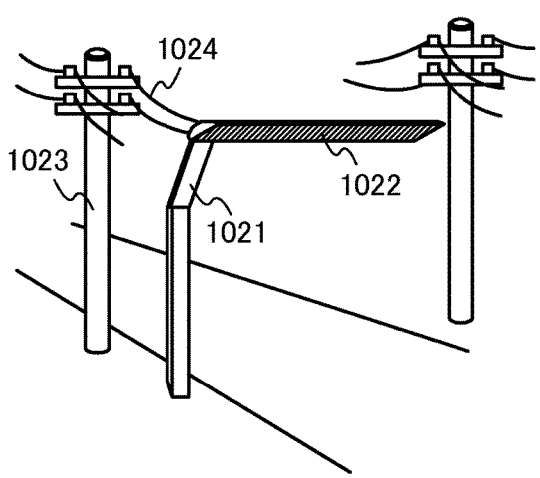

FIG. 10C illustrates a streetlight. The streetlight includes a support 1021 and a lighting portion 1022. In the lighting portion 1022, the light-emitting elements described in any of Embodiments 1 to 5 are used. The light-emitting elements have features of a high luminance, low driving voltage, and low power consumption. The lighting portion including those light-emitting elements has similar features; therefore, low power consumption of this streetlight can be achieved.

Note that a power source voltage can be supplied to the streetlight through a power line 1024 on a utility pole 1023 as illustrated in FIG. 10C. Note that the method for supplying the power source voltage is not limited to this case; for example, a photoelectric converter may be provided in the support 1021 so that voltage obtained from the photoelectric converter can be used as a power source voltage.

Figure 10D:
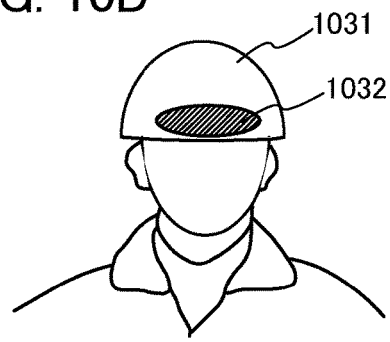
Figure 10E:
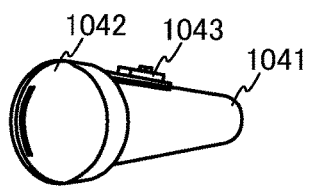

FIGS. 10D and 10E illustrate examples in which a lighting device is applied to a portable light. FIG. 10D illustrates a structure of a wearable light and FIG. 10E illustrates a structure of a handheld light.

FIG. 10D illustrates a wearable light. The wearable light includes a mounting portion 1031 and a lighting portion 1032 fixed to the mounting portion 1031. In the lighting portion 1032, the light-emitting elements described in any of Embodiments 1 to 5 are used. The light-emitting elements have features of a high luminance, low driving voltage, and low power consumption. The lighting portion including those light-emitting elements has similar features; therefore, low power consumption of this wearable light can be achieved.

Note that the structure of the wearable light is not limited to that illustrated in FIG. 10D, and for example, the following structure can be employed: the mounting portion 1031 is formed as a ring belt of flat braid or elastic braid, the lighting portion 1032 is fixed to the belt, and the belt is directly tied around the head.

FIG. 10E illustrates a handheld light. The handheld light includes a housing 1041, a lighting portion 1042, and a switch 1043. In the lighting portion 1042, the light-emitting elements described in any of Embodiments 1 to 5 are used. The light-emitting elements have features of a high luminance, low driving voltage, and low power consumption. The lighting portion 1042 including those light-emitting elements has similar features; thus, low power consumption of this handheld light can be achieved.

The switch 1043 has a function of controlling emission or non-emission of the lighting portion 1042. The switch 1043 can also have a function of controlling, for example, the luminance of the lighting portion 1042 during light emission.

As described above, the application range of the light-emitting device is so wide that the light-emitting device can be applied to lighting devices in all fields. With use of a lighting device including the light-emitting elements described in Embodiments 1 to 5, a lighting device having a low-power-consumption display portion which exhibits high luminance light emission can be provided.

Example 1

In this example, light-emitting elements that are one embodiment of the present invention are described with reference to FIGS. 11A and 11B. Chemical formulae of the materials used in this example and Examples 2 and 3 are shown below.

[Chemical 1]

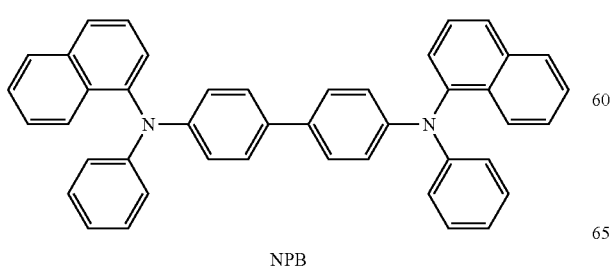

NPB

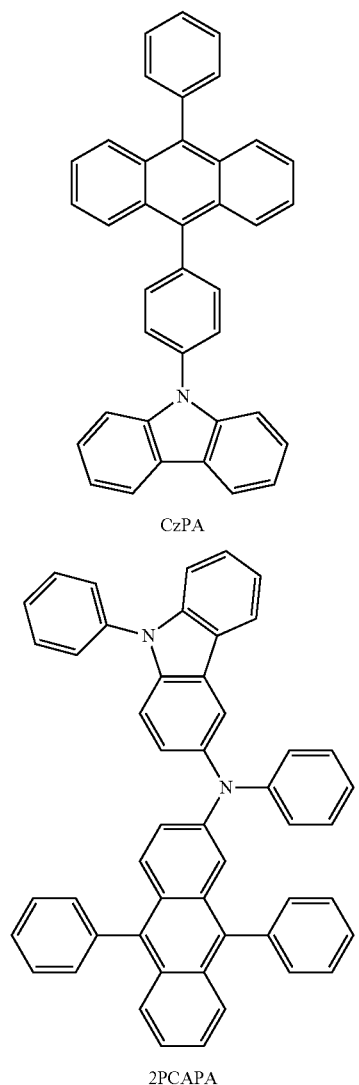

CzPA

2PCAPA

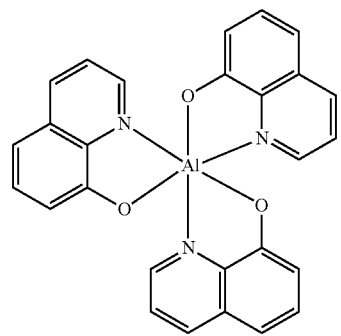

Alq

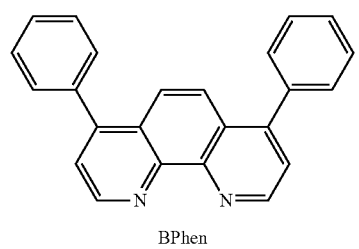

BPhen

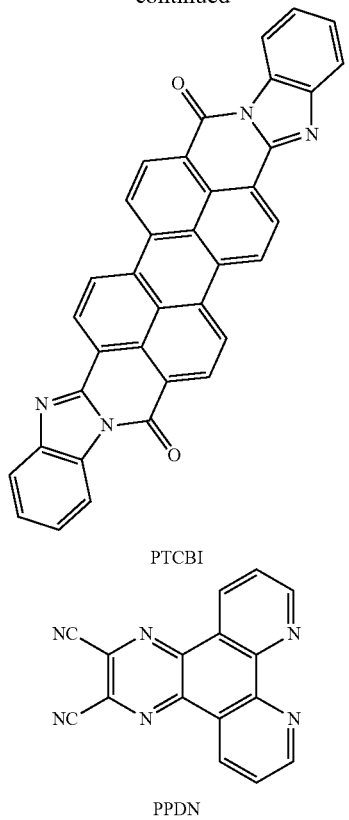

PTCBI

PPDN

Methods for manufacturing light-emitting elements 1 to 4 and a reference light-emitting element 5 in this example are described below.

Figure 11A:
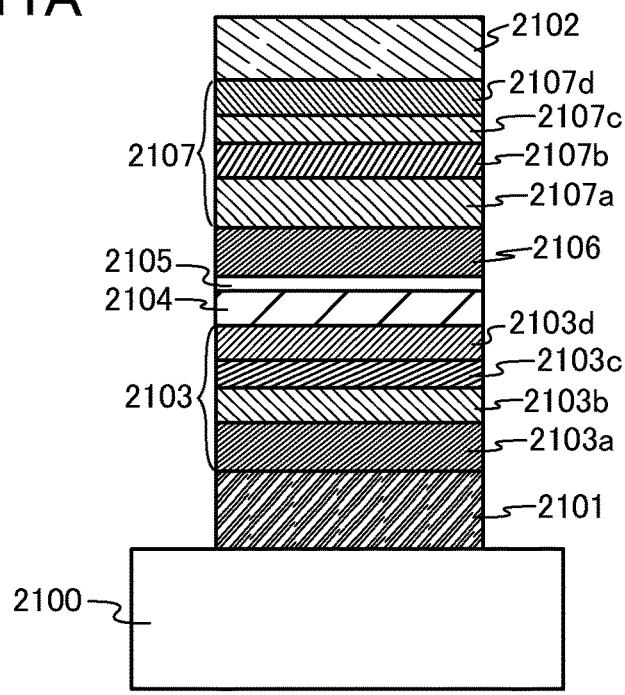
FIGS. 11A and 11B illustrate element structures of light-emitting elements described in Examples 1 and 2.

First, the light-emitting element 1 is described (see FIG. 11A). Indium tin oxide containing silicon oxide was deposited over a substrate 2100 by a sputtering method to form a first electrode 2101. The first electrode 2101 had a thickness of 110 nm and an area of 2 mm×2 mm.

Next, the substrate 2100 on which the first electrode 2101 was formed was fixed to a substrate holder provided in a vacuum evaporation apparatus in such a way that a surface of the substrate on which the first electrode 2101 was formed faced downward, and then the pressure was reduced to approximately $10^{-4}$ Pa. After that, NPB that is a hole-transport material and molybdenum(VI) oxide that is an acceptor material were co-evaporated on the first electrode 2101 to form a first charge-generation layer 2103a containing a composite material of an organic compound and an inorganic compound. The thickness of the first charge-generation layer 2103a was 50 nm. The weight ratio of NPB to molybdenum(VI) oxide was adjusted to 4:1 (=NPB: molybdenum oxide). Note that the co-evaporation method is an evaporation method in which evaporation is carried out using a plurality of evaporation sources simultaneously in one treatment chamber.

Next, NPB was deposited to a thickness of 10 nm on the first charge-generation layer 2103a by an evaporation method using resistance heating to form a hole-transport layer 2103b.

Furthermore, CzPA and 2PCAPA were co-evaporated to form a light-emitting layer 2103c with a thickness of 30 nm on the hole-transport layer 2103b. Here, the weight ratio of CzPA to 2PCAPA was adjusted to 1:0.05 (=CzPA:2PCAPA).

Note that CzPA is an electron-transport material and 2PCAPA that is a guest material is a material exhibiting green light emission.

After that, Alq was deposited on the light-emitting layer 2103c to a thickness of 10 nm by an evaporation method using resistance heating to form an electron-transport layer 2103d. Thus, a first EL layer 2103 including the first charge-generation layer 2103a, the hole-transport layer 2103b, the light-emitting layer 2103c, and the electron-transport layer 2103d was formed.

Next, BPhen and lithium (Li) were co-evaporated to form an electron-injection buffer layer 2104 with a thickness of 20 nm on the electron-transport layer 2103d. Here, the weight ratio of BPhen to lithium (Li) was adjusted to 1:0.02 (=BPhen:Li).

Next, PTCBI and lithium (Li) were co-evaporated to form an electron-relay layer 2105 with a thickness of 3 nm on the electron-injection buffer layer 2104. Here, the weight ratio of PTCBI to lithium (Li) was adjusted to 1:0.02 (=PTCBI: Li). Note that the LUMO level of PTCBI is approximately −4.0 eV according to the result of cyclic voltammetry (CV).

Next, NBP that is a hole-transport material and molybdenum(VI) oxide that is an acceptor material were co-evaporated on the electron-relay layer 2105 to form a second charge-generation layer 2106. The thickness of the second charge-generation layer 2106 was 60 nm. The weight ratio of NPB to molybdenum(VI) oxide was adjusted to 4:1 (=NPB:molybdenum oxide).

Next, a second EL layer 2107 was formed on the second charge-generation layer 2106. A method for manufacturing the second EL layer 2107 is described below. First, NPB was deposited to a thickness of 10 nm on the second charge-generation layer 2106 to form a hole-transport layer 2107a by an evaporation method using resistance heating.

After that, CzPA and 2PCAPA were co-evaporated to form a light-emitting layer 2107b with a thickness of 30 nm on the hole-transport layer 2107a. Here, the weight ratio of CzPA to 2PCAPA was adjusted to 1:0.05 (=CzPA:2PCAPA). That is, the structure of the light-emitting layer 2107b included in the second EL layer 2107 was the same as that of the light-emitting layer 2103c included in the first EL layer 2103.

Next, Alq with a thickness of 10 nm and BPhen with a thickness of 20 nm were stacked on the light-emitting layer 2107b by evaporation to form an electron-transport layer 2107c. Then, lithium fluoride (LiF) was evaporated to a thickness of 1 nm on the electron-transport layer 2107c to form an electron-injection layer 2107d. Thus, the second EL layer 2107 including the hole-transport layer 2107a, the light-emitting layer 2107b, the electron-transport layer 2107c, and the electron-injection layer 2107d was formed.

Lastly, aluminum (Al) was deposited to a thickness of 200 nm on the electron-injection layer 2107d by an evaporation method using resistance heating to form a second electrode 2102. Thus, the light-emitting element 1 was manufactured.

Next, the light-emitting element 2 is described. The light-emitting element 2 was manufactured in a manner similar to that of the light-emitting element 1, except for an electron-relay layer 2105. Therefore, for the structure and the manufacturing method of the light-emitting element 2, the description above is to be referred to, except for the electron-relay layer 2105. As the electron-relay layer 2105 included in the light-emitting element 2, PPDN, which is an electron-transport material and lithium (Li), which is a donor material were co-evaporated to a thickness of 3 nm on the electron-injection buffer layer 2104. Here, the weight ratio of PPDN to lithium (Li) was adjusted to 1:0.02

(=PPDN:Li). Note that the LUMO level of PPDN is approximately −3.83 eV according to the result of the measurements by cyclic voltammetry (CV).

Next, the light-emitting element 3 is described. The light-emitting element 3 was manufactured in a manner similar to that of the light-emitting element 1, except for an electron-relay layer 2105. Therefore, for the structure and the manufacturing method of the light-emitting element 3, the description above is to be referred to, except for the electron-relay layer 2105. As the electron-relay layer 2105 included in the light-emitting element 3, PTCBI, which is an electron-transport material and lithium oxide ($Li_2O$), which is a donor material were co-evaporated to a thickness of 3 nm on the electron-injection buffer layer 2104. Here, the weight ratio of PTCBI to lithium oxide ($Li_2O$) was adjusted to 1:0.02 (=PTCBI:$Li_2O$).

Next, the light-emitting element 4 is described. The light-emitting element 4 was manufactured in a manner similar to that of the light-emitting element 1, except for an electron-relay layer 2105. Therefore, for the structure and the manufacturing method of the light-emitting element 4, the description above is to be referred to, except for the electron-relay layer 2105. As the electron-relay layer 2105 included in the light-emitting element 4, PPDN, which is an electron-transport material and lithium oxide ($Li_2O$), which is a donor material were co-evaporated to a thickness of 3 nm on the electron-injection buffer layer 2104. Here, the weight ratio of PPDN to lithium oxide ($Li_2O$) was adjusted to 1:0.02 (=PPDN:$Li_2O$).

Figure 11B:
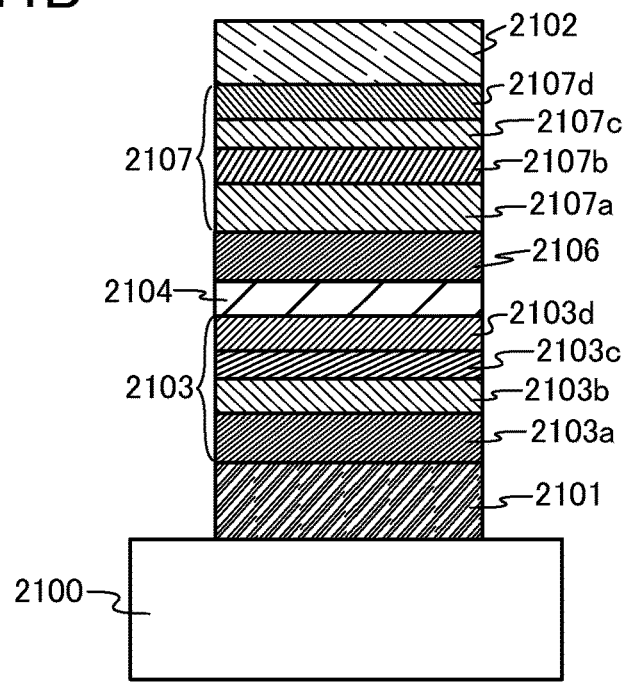

Next, the reference light-emitting element 5 is described (see FIG. 11B). The reference light-emitting element 5 had the structure of the light-emitting elements 1 to 4, from which the electron-relay layer 2105 was removed. The other layers were formed by manufacturing methods similar to those of the light-emitting elements 1 to 4. That is, in the reference light-emitting element 5, after the electron-injection buffer layer 2104 was formed, the second charge-generation layer 2106 was formed on the electron-injection buffer layer 2104. Thus, the reference light-emitting element 5 of this example was formed.

Table 1 below shows the element structures of the light-emitting elements 1 to 4 and the reference light-emitting element 5.

TABLE 1

| | | Light-emitting Element 1 | Light-emitting Element 2 | Light-emitting Element 3 | Light-emitting Element 4 | Reference Light-emitting Element 5 |
|---|---|---|---|---|---|---|
| 2101 | | ITSO 110 nm | ITSO 110 nm | ITSO 110 nm | ITSO 110 nm | ITSO 110 nm |
| 2103 | 2103a | NPB:MoOx (=4:1) 50 nm | NPB:MoOx (=4:1) 50 nm | NPB:MoOx (=4:1) 50 nm | NPB:MoOx (=4:1) 50 nm | NPB:MoOx (=4:1) 50 nm |
| | 2103b | NPB 10 nm | NPB 10 nm | NPB 10 nm | NPB 10 nm | NPB 10 nm |
| | 2103c | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm |
| | 2103d | Alq 10 nm | Alq 10 nm | Alq 10 nm | Alq 10 nm | Alq 1 nm |
| 2104 | | BPhen:Li (=1:0.02) 20 nm | BPhen:Li (=1:0.02) 20 nm | BPhen:Li (=1:0.02) 20 nm | BPhen:Li (=1:0.02) 20 nm | BPhen:Li (=1:0.02) 20 nm |
| 2105 | | PTCBI:Li (=1:0.02) 3 nm | PPDN:Li (=1:0.02) 3 nm | PTCBI:Li2O (=1:0.02) 3 nm | PPDN:Li2O (=1:0.02) 3 nm | — |
| 2106 | | NPB:MoOx (=4:1) 60 nm | NPB:MoOx (=4:1) 60 nm | NPB:MoOx (=4:1) 60 nm | NPB:MoOx (=4:1) 60 nm | NPB:MoOx (=4:1) 60 nm |
| 2107 | 2107a | NPB 10 nm | NPB 10 nm | NPB 10 nm | NPB 10 nm | NPB 10 nm |
| | 2107b | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm |
| | 2107c | Alq 10 nm BPhen 20 nm | Alq 10 nm BPhen 20 nm | Alq 10 nm BPhen 20 nm | Alq 10 nm BPhen 20 nm | Alq 10 nm BPhen 20 nm |
| | 2107d | LiF 1 nm | LiF 1 nm | LiF 1 nm | LiF 1 nm | LiF 1 nm |
| 2102 | | Al 200 nm | Al 200 nm | Al 200 nm | Al 200 nm | Al 200 nm |

The thus obtained light-emitting elements 1 to 4 and reference light-emitting element 5 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 12:
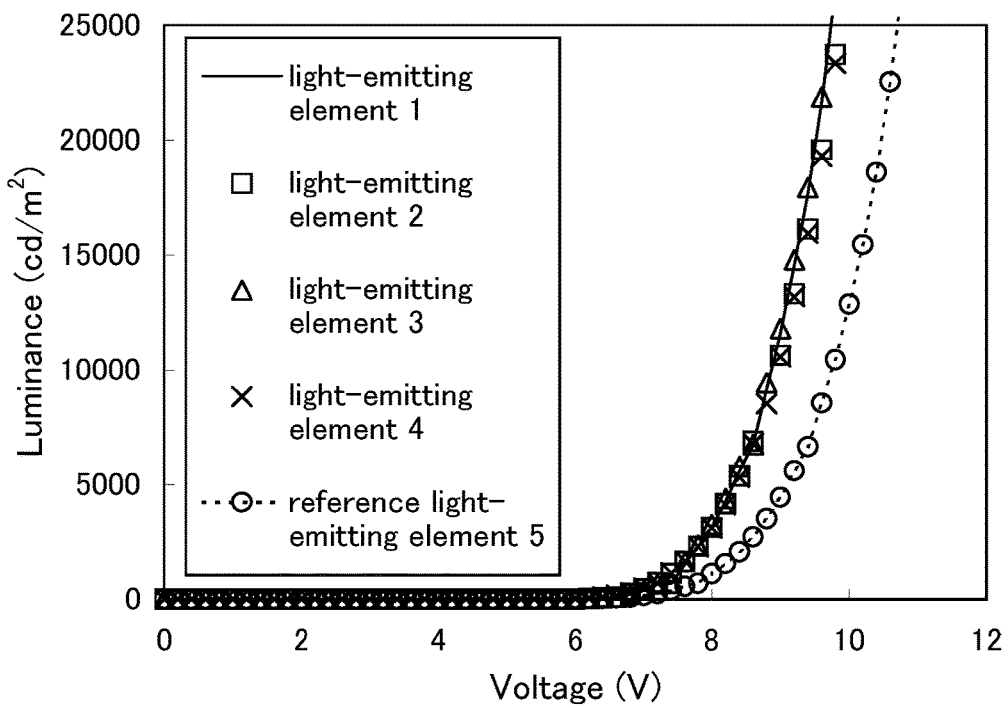
FIG. 12 shows characteristics of the light-emitting elements described in Example 1.
Figure 13:
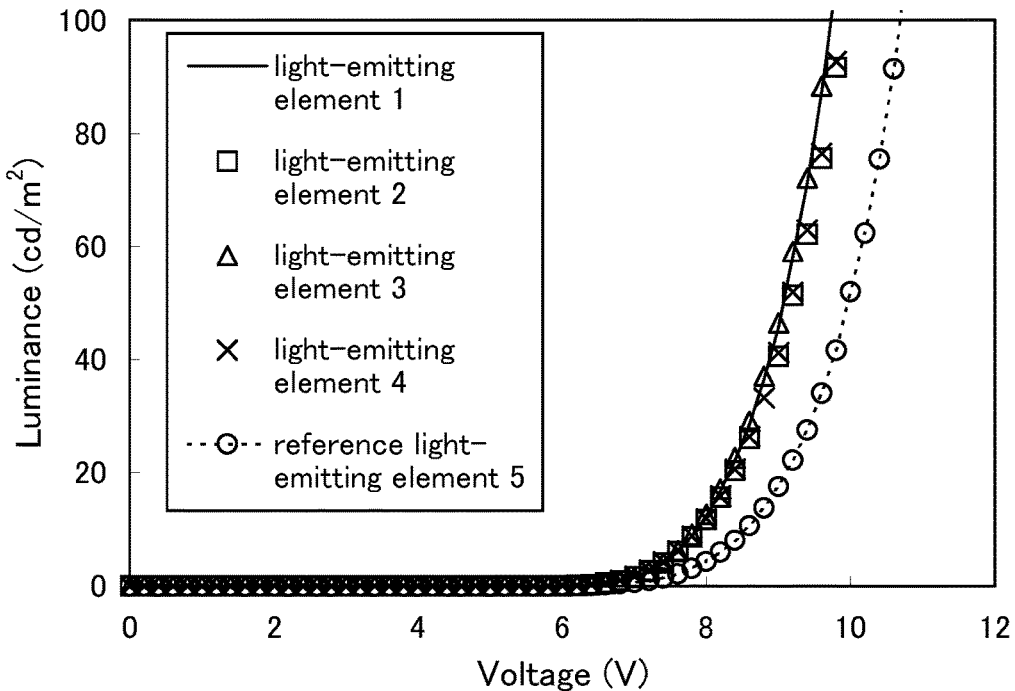
FIG. 13 shows characteristics of the light-emitting elements described in Example 1.

FIG. 12 shows voltage-luminance characteristics of the light-emitting elements 1 to 4 and the reference light-emitting element 5. In FIG. 12, the horizontal axis represents applied voltage (V) and the vertical axis represents luminance ($cd/m^2$). In addition, FIG. 13 shows voltage-current density characteristics of the light-emitting elements 1 to 4 and the reference light-emitting element 5. In FIG. 13, the horizontal axis represents voltage (V) and the vertical axis represents current density ($mA/cm^2$). Moreover, Table 2 below shows voltages of the light-emitting elements at a luminance of approximately 1000 $cd/m^2$.

TABLE 2

|  | Voltage (V) |
| --- | --- |
| Light-emitting Element 1 | 7.4 |
| Light-emitting Element 2 | 7.4 |
| Light-emitting Element 3 | 7.4 |
| Light-emitting Element 4 | 7.4 |
| Reference Light-emitting Element 5 | 8.0 |

FIG. 12 indicates that the light-emitting elements 1 to 4 in each of which the electron-relay layer is provided have a higher luminance than the reference light-emitting element 5. In addition, FIG. 13 indicates that the light-emitting elements 1 to 4 in each of which the electron-relay layer is provided have a higher current density than the reference light-emitting element 5.

Thus, it was confirmed that the light-emitting elements 1 to 4 of this example had characteristics as a light-emitting element and functioned well. In addition, it was confirmed that the light-emitting elements 1 to 4 were light-emitting elements capable of being driven at a lower voltage than the reference light-emitting element 5.

Example 2

In this example, light-emitting elements that are one embodiment of the present invention are described with reference to FIGS. 11A and 11B. Note that in light-emitting elements and a reference light-emitting element in this example, for the part that is the same as or similar to that described in Example 1, the description above is to be referred to.

Methods for manufacturing light-emitting elements 6 to 9 and a reference light-emitting element 10 of this example are described below.

First, the light-emitting element 6 is described (see FIG. 11A). The light-emitting element 6 of this example was manufactured in a manner similar to that of the light-emitting element 1 described in Example 1, except for the electron-injection buffer layer 2104. Therefore, for the structure and the manufacturing method of the light-emitting element 6, the description in Example 1 is to be referred to, except for the electron-injection buffer layer 2104. In the light-emitting element 6 of this example, BPhen, which is an electron-transport material and lithium oxide ($Li_2O$), which is a donor material were co-evaporated to form the electron-injection buffer layer 2104 to a thickness of 20 nm on the electron-transport layer 2103d. Here, the weight ratio of BPhen to lithium oxide ($Li_2O$) was adjusted to 1:0.02 (=BPhen:$Li_2O$).

Next, the light-emitting element 7 is described. The light-emitting element 7 of this example was manufactured in a manner similar to that of the light-emitting element 2 described in Example 1, except for the electron-injection buffer layer 2104. Therefore, for the structure and the manufacturing method of the light-emitting element 7, the description in Example 1 is to be referred to, except for the electron-injection buffer layer 2104. In the light-emitting element 7 of this example, BPhen, which is an electron-transport material and lithium oxide ($Li_2O$), which is a donor material were co-evaporated to form the electron-injection buffer layer 2104 to a thickness of 20 nm on the electron-transport layer 2103d. Here, the weight ratio of BPhen to lithium oxide ($Li_2O$) was adjusted to 1:0.02 (=BPhen:$Li_2O$).

Next, the light-emitting element 8 is described. The light-emitting element 8 of this example was manufactured in a manner similar to that of the light-emitting element 3 described in Example 1, except for the electron-injection buffer layer 2104. Therefore, for the structure and the manufacturing method of the light-emitting element 8, the description in Example 1 is to be referred to, except for the electron-injection buffer layer 2104. In the light-emitting element 8 of this example, BPhen, which is an electron-transport material and lithium oxide ($Li_2O$), which is a donor material were co-evaporated to form the electron-injection buffer layer 2104 to a thickness of 20 nm on the electron-transport layer 2103d. Here, the weight ratio of BPhen to lithium oxide ($Li_2O$) was adjusted to 1:0.02 (=BPhen:$Li_2O$).

Next, the light-emitting element 9 is described. The light-emitting element 9 of this example was manufactured in a manner similar to that of the light-emitting element 4 described in Example 1, except for the electron-injection buffer layer 2104. Therefore, for the structure and the manufacturing method of the light-emitting element 9, the description in Example 1 is to be referred to, except for the electron-injection buffer layer 2104. In the light-emitting element 9 of this example, BPhen, which is an electron-transport material and lithium oxide ($Li_2O$), which is a donor material were co-evaporated to form the electron-injection buffer layer 2104 to a thickness of 20 nm on the electron-transport layer 2103d. Here, the weight ratio of BPhen to lithium oxide ($Li_2O$) was adjusted to 1:0.02 (=BPhen:$Li_2O$).

Next, the reference light-emitting element 10 is described (see FIG. 11B). The reference light-emitting element 10 had the structure of the light-emitting elements 6 to 9, from which the electron-relay layer 2105 was removed. The other layers were formed by manufacturing methods similar to those of the light-emitting elements 6 to 9. That is, in the reference light-emitting element 10, after the electron-injection buffer layer 2104 was formed, the second charge-generation layer 2106 was formed on the electron-injection buffer layer 2104. Thus, the reference light-emitting element 10 of this example was obtained.

Table 3 below shows the element structures of the light-emitting elements 6 to 9 and the reference light-emitting element 10.

TABLE 3

|  |  | Light-emitting Element 6 | Light-emitting Element 7 | Light-emitting Element 8 | Light-emitting Element 9 | Reference Light-emitting Element 10 |
| --- | --- | --- | --- | --- | --- | --- |
| 2101 |  | ITSO 110 nm | ITSO 110 nm | ITSO 110 nm | ITSO 110 nm | ITSO 110 nm |
| 2103 | 2103a | NPB:MoOx (=4:1) 50 nm | NPB:MoOx (=4:1) 50 nm | NPB:MoOx (=4:1) 50 nm | NPB:MoOx (=4:1) 50 nm | NPB:MoOx (=4:1) 50 nm |
|  | 2103b | NPB 10 nm | NPB 10 nm | NPB 10 nm | NPB 10 nm | NPB 10 nm |

TABLE 3-continued

|  | Light-emitting Element 6 | Light-emitting Element 7 | Light-emitting Element 8 | Light-emitting Element 9 | Reference Light-emitting Element 10 |
|---|---|---|---|---|---|
| 2103c | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm |
| 2103d | Alq 10 nm | Alq 10 nm | Alq 10 nm | Alq 10 nm | Alq 1 nm |
| 2104 | BPhen:Li$_2$O (=1:0.02) 20 nm | BPhen:Li$_2$O (=1:0.02) 20 nm | BPhen:Li$_2$O (=1:0.02) 20 nm | BPhen:Li$_2$O (=1:0.02) 20 nm | BPhen:Li$_2$O (=1:0.02) 20 nm |
| 2105 | PTCBI:Li (=1:0.02) 3 nm | PPDN:Li (=1:0.02) 3 nm | PTCBI:Li$_2$O (=1:0.02) 3 nm | PPDN:Li$_2$O (=1:0.02) 3 nm | — |
| 2106 | NPB:MoOx (=4:1) 60 nm | NPB:MoOx (=4:1) 60 nm | NPB:MoOx (=4:1) 60 nm | NPB:MoOx (=4:1) 60 nm | NPB:MoOx (=4:1) 60 nm |
| 2107 2107a | NPB 10 nm | NPB 10 nm | NPB 10 nm | NPB 10 nm | NPB 10 nm |
| 2107b | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm | CzPA:2PCAPA (=1:0.05) 30 nm |
| 2107c | Alq 10 nm BPhen 20 nm | Alq 10 nm BPhen 20 nm | Alq 10 nm BPhen 20 nm | Alq 10 nm BPhen 20 nm | Alq 10 nm BPhen 20 nm |
| 2107d | LiF 1 nm | LiF 1 nm | LiF 1 nm | LiF 1 nm | LiF 1 nm |
| 2102 | Al 200 nm | Al 200 nm | Al 200 nm | Al 200 nm | Al 200 nm |

The thus obtained light-emitting elements 6 to 9 and reference light-emitting element 10 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 14:
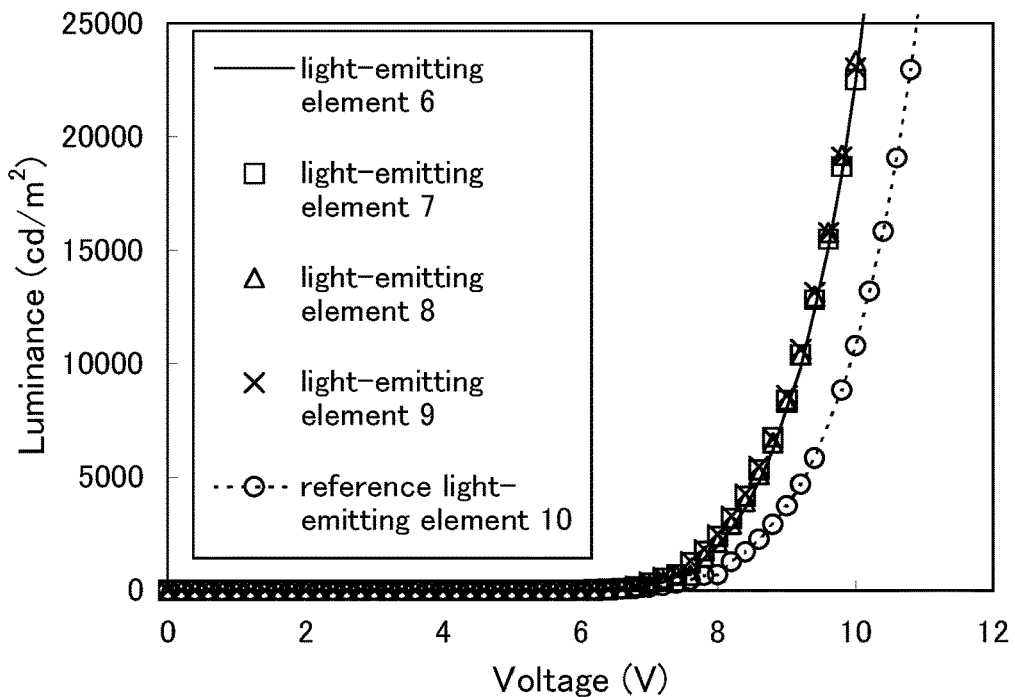
FIG. 14 shows characteristics of the light-emitting elements described in Example 2.
Figure 15:
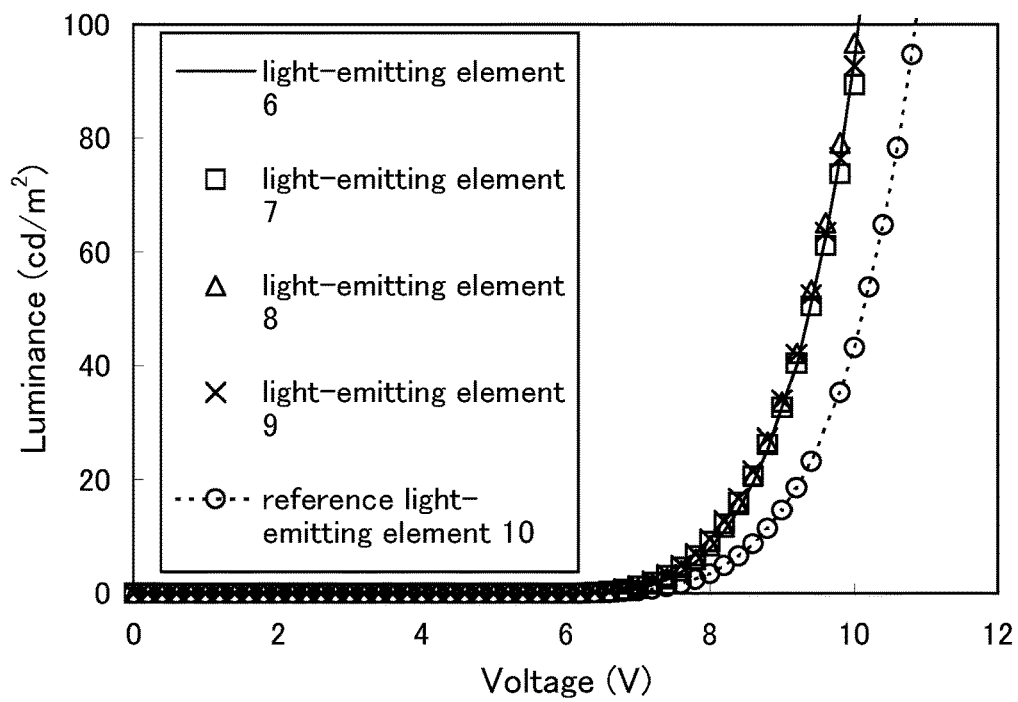
FIG. 15 shows characteristics of the light-emitting elements described in Example 2.

FIG. 14 shows voltage-luminance characteristics of the light-emitting elements 6 to 9 and the reference light-emitting element 10. In FIG. 14, the horizontal axis represents applied voltage (V) and the vertical axis represents luminance (cd/m$^2$). In addition, FIG. 15 shows voltage-current density characteristics of the light-emitting elements 6 to 9 and the reference light-emitting element 10. In FIG. 15, the horizontal axis represents voltage (V) and the vertical axis represents current density (mA/cm$^2$). Moreover, Table 4 below shows voltages of the light-emitting elements at a luminance of approximately 1000 cd/m$^2$.

TABLE 4

|  | Voltage (V) |
|---|---|
| Light-emitting Element 6 | 7.6 |
| Light-emitting Element 7 | 7.6 |
| Light-emitting Element 8 | 7.6 |
| Light-emitting Element 9 | 7.6 |
| Reference Light-emitting Element 10 | 8.2 |

FIG. 14 indicates that the light-emitting elements 6 to 9 in each of which the electron-relay layer is provided have a higher luminance than the reference light-emitting element 10. In addition, FIG. 15 indicates that the light-emitting elements 6 to 9 in each of which the electron-relay layer is provided have a higher current density than the reference light-emitting element 10.

Thus, it was confirmed that the light-emitting elements 6 to 9 of this example had characteristics as a light-emitting element and functioned well. In addition, it was confirmed that the light-emitting elements 6 to 9 were light-emitting elements capable of being driven at a low voltage.

Example 3

In this example, a light-emitting element that is one embodiment of the present invention is described with reference to FIGS. 11A and 11B. Note that in a light-emitting element and a reference light-emitting element in this example, for the part that is the same as or similar to that described in Example 1, the description above is to be referred to.

A method for manufacturing a light-emitting element 11 and a reference light-emitting element 12 of this example is described below.

First, the light-emitting element 11 is described (see FIG. 11A). The light-emitting element 11 of this example was manufactured in a manner similar to that of the light-emitting element 1 described in Example 1, except for an electron-transport layer 2103d of the first EL layer 2103 and an electron-injection buffer layer 2104. Therefore, for the structure and the manufacturing method of the light-emitting element 11, the description in Example 1 is to be referred to, except for the electron-transport layer 2103d and the electron-injection buffer layer 2104. In the light-emitting element 11 of this example, Alq with a thickness of 10 nm and BPhen with a thickness of 20 nm were stacked on the light-emitting layer 2103c by evaporation to form an electron-transport layer 2103d. Further, lithium oxide (Li$_2$O) was evaporated to form the electron-injection buffer layer 2104 to a thickness of 0.1 nm on the electron-transport layer 2103d. Thus, the light-emitting element 11 of this example was obtained.

Next, the reference light-emitting element 12 is described (see FIG. 11B). The reference light-emitting element 12 of this example had the structure of the light-emitting element 11, from which the electron-relay layer 2105 was removed. The other layers were formed by manufacturing methods similar to those of the light-emitting element 11. In the reference light-emitting element 12, after the electron-injection buffer layer 2104 was formed, the second charge-generation layer 2106 was formed on the electron-injection buffer layer 2104. Thus, the reference light-emitting element 12 of this example was obtained.

Table 5 below shows the element structures of the light-emitting element 11 and the reference light-emitting element 12.

TABLE 5

|  |  | Light-emitting Element 11 | Reference Light-emitting Element 12 |
|---|---|---|---|
|  | 2101 | ITSO<br>110 nm | ITSO<br>110 nm |
| 2103 | 2103a | NPB:MoOx<br>(=4:1)<br>50 nm | NPB:MoOx<br>(=4:1)<br>50 nm |
|  | 2103b | NPB<br>10 nm | NPB<br>10 nm |
|  | 2103c | CzPA:2PCAPA<br>(=1:0.05)<br>30 nm | CzPA:2PCAPA<br>(=1:0.05)<br>30 nm |
|  | 2103d | Alq<br>10 nm<br>BPhen<br>20 nm | Alq<br>1 nm<br>BPhen<br>20 nm |
|  | 2104 | Li$_2$O<br>0.1 nm | Li$_2$O<br>0.1 nm |
|  | 2105 | PTCBI:Li<br>(=1:0.02)<br>3 nm | — |
|  | 2106 | NPB:MoOx<br>(=4:1)<br>60 nm | NPB:MoOx<br>(=4:1)<br>60 nm |
| 2107 | 2107a | NPB<br>10 nm | NPB<br>10 nm |
|  | 2107b | CzPA:2PCAPA<br>(=1:0.05)<br>30 nm | CzPA:2PCAPA<br>(=1:0.05)<br>30 nm |
|  | 2107c | Alq<br>10 nm<br>BPhen<br>20 nm | Alq<br>10 nm<br>Bphen<br>20 nm |
|  | 2107d | LiF<br>1 nm | LiF<br>1 nm |
|  | 2102 | Al<br>200 nm | Al<br>200 nm |

The thus obtained light-emitting element 11 and reference light-emitting element 12 were sealed in a glove box under a nitrogen atmosphere so that they were not exposed to atmospheric air. After that, the operating characteristics of these light-emitting elements were measured. The measurement was carried out at room temperature (under an atmosphere in which the temperature was kept at 25° C.).

Figure 16:
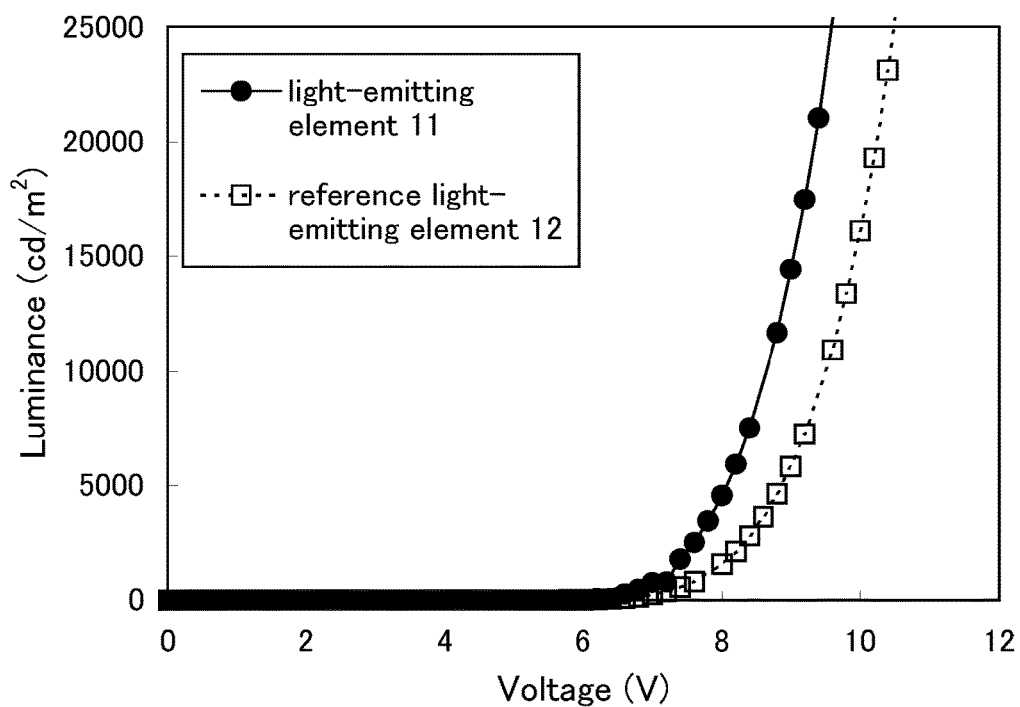
FIG. 16 shows characteristics of light-emitting elements described in Example 3.
Figure 17:
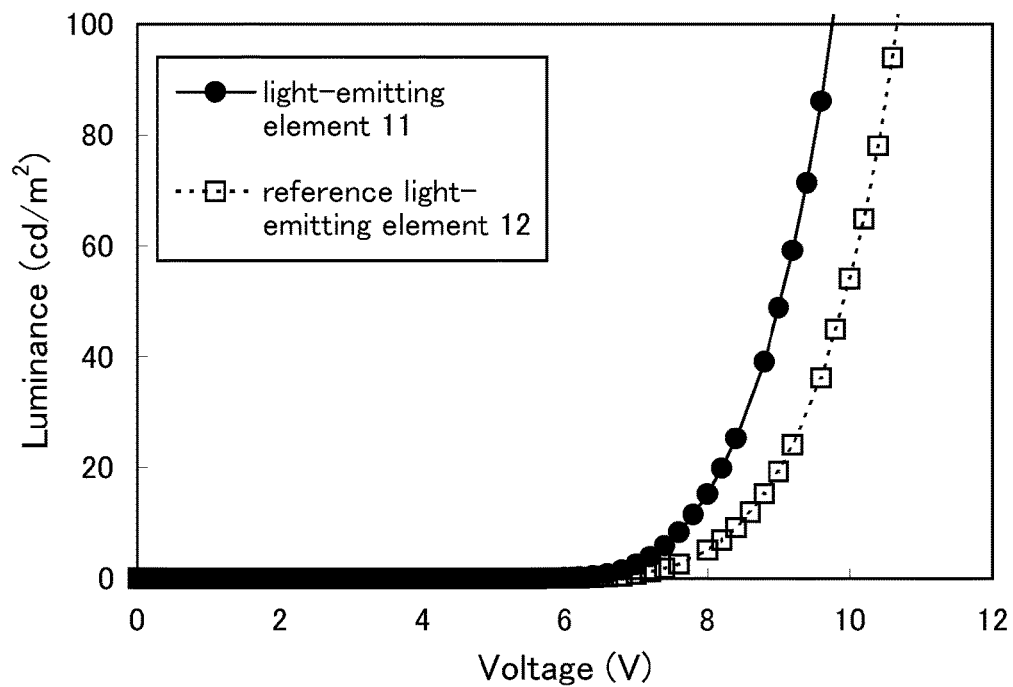
FIG. 17 shows characteristics of the light-emitting elements described in Example 3.

FIG. 16 shows voltage-luminance characteristics of the light-emitting element 11 and the reference light-emitting element 12. In FIG. 16, the horizontal axis represents applied voltage (V) and the vertical axis represents luminance (cd/m$^2$). In addition, FIG. 17 shows voltage-current density characteristics of the light-emitting element 11 and the reference light-emitting element 12. In FIG. 17, the horizontal axis represents voltage (V) and the vertical axis represents current density (mA/cm$^2$). Moreover, Table 6 below shows voltages of the light-emitting elements at a luminance of approximately 1000 cd/m$^2$.

TABLE 6

|  | Voltage (V) |
|---|---|
| Light-emitting Element 11 | 7.2 |
| Reference Light-emitting Element 12 | 7.6 |

FIG. 16 indicates that the light-emitting element 11 in which the electron-relay layer is provided have a higher luminance than the reference light-emitting element 12. In addition, FIG. 17 indicates that the light-emitting element 11 in which the electron-relay layer is provided have a higher current density than the reference light-emitting element 12.

Thus, it was confirmed that the light-emitting element 11 of this example had characteristics as a light-emitting element and functioned well. In addition, it was confirmed that the light-emitting element 11 was a light-emitting element capable of being driven at a low voltage.

This application is based on Japanese Patent Application serial no. 2009-131096 filed with Japan Patent Office on May 29, 2009, the entire contents of which are hereby incorporated by reference.

The invention claimed is:

1. A light-emitting element comprising:
an anode;
a first light-emitting layer over the anode;
a second light-emitting layer over the first light-emitting layer;
a first layer over the second light-emitting layer, the first layer including a first donor material;
a second layer over and in direct contact with the first layer, the second layer including an electron-transport material;
a third layer over and in direct contact with the second layer, the third layer including a hole-transport material and an acceptor material;
a third light-emitting layer over the third layer;
a fourth light-emitting layer over the third light-emitting layer; and
a cathode over the fourth light-emitting layer.

2. The light-emitting element according to claim 1, wherein the second layer further includes a second donor material.

3. The light-emitting element according to claim 1, wherein the first donor material is selected from the group consisting of an alkali metal, an alkaline earth metal, a rare earth metal, an alkali metal compound, an alkaline earth metal compound, and a rare earth metal compound.

4. The light-emitting element according to claim 1, wherein the third layer is a layer in which the acceptor material is added so that a weight ratio of the acceptor material to the hole-transport material is greater than or equal to 0.1:1 and less than or equal to 4.0:1.

5. The light-emitting element according to claim 1, wherein the third layer is a stack of a layer including the hole-transport material and a layer including the acceptor material.

6. The light-emitting element according to claim 1, wherein the acceptor material is an oxide of a metal belonging to Groups 4 to 8 of the periodic table.

7. The light-emitting element according to claim 1, wherein the acceptor material is a molybdenum oxide.

8. The light-emitting element according to claim 1, wherein luminescent color emitted from a stacked layer of the first light-emitting layer and the second light-emitting layer is different from luminescent color emitted from a stacked layer of the third light-emitting layer and the fourth light-emitting layer.

9. A light-emitting device manufactured using the light-emitting element according to claim 1.

10. An electronic device comprising the light-emitting device according to claim 9.

11. A lighting device comprising the light-emitting device according to claim 9.

12. A light-emitting element comprising:
an anode;
a first light-emitting layer over the anode;
a second light-emitting layer over the first light-emitting layer;
a first layer over the second light-emitting layer, the first layer including a first donor material;
a second layer over the first layer, the second layer including an electron-transport material;
a third layer over the second layer, the third layer including a hole-transport material and an acceptor material;
a third light-emitting layer over the third layer;
a fourth light-emitting layer over the third light-emitting layer; and
a cathode over the fourth light-emitting layer,
wherein a LUMO level of the second layer is between a LUMO level of the second light-emitting layer and an acceptor level of the acceptor material in the third layer.

13. The light-emitting element according to claim 12, wherein the second layer further includes a second donor material.

14. The light-emitting element according to claim 12, wherein the first donor material is selected from the group consisting of an alkali metal, an alkaline earth metal, a rare earth metal, an alkali metal compound, an alkaline earth metal compound, and a rare earth metal compound.

15. The light-emitting element according to claim 12, wherein the third layer is a layer in which the acceptor material is added so that a weight ratio of the acceptor material to the hole-transport material is greater than or equal to 0.1:1 and less than or equal to 4.0:1.

16. The light-emitting element according to claim 12, wherein the third layer is a stack of a layer including the hole-transport material and a layer including the acceptor material.

17. The light-emitting element according to claim 12, wherein the acceptor material is an oxide of a metal belonging to Groups 4 to 8 of the periodic table.

18. The light-emitting element according to claim 12, wherein the acceptor material is a molybdenum oxide.

19. The light-emitting element according to claim 12, wherein luminescent color emitted from a stacked layer of the first light-emitting layer and the second light-emitting layer is different from luminescent color emitted from a stacked layer of the third light-emitting layer and the fourth light-emitting layer.

20. A light-emitting device manufactured using the light-emitting element according to claim 12.

21. An electronic device comprising the light-emitting device according to claim 20.

22. A lighting device comprising the light-emitting device according to claim 20.

23. The light-emitting element according to claim 12,
wherein the second layer is over and in contact with the first layer, and
wherein the third layer is over and in contact with the second layer.

* * * * *